(12) United States Patent
Neely

(10) Patent No.: US 9,654,876 B2
(45) Date of Patent: May 16, 2017

(54) MULTIBAND AUDIO COMPRESSION SYSTEM AND METHOD

(71) Applicant: FATHER FLANAGAN'S BOYS' HOME, Omaha, NE (US)

(72) Inventor: Stephen Taylor Neely, Omaha, NE (US)

(73) Assignee: Father Flanagan's Boys' Home, Omaha, NE (US)

( * ) Notice: Subject to any disclaimer, the term of this patent is extended or adjusted under 35 U.S.C. 154(b) by 0 days.

(21) Appl. No.: 14/418,353

(22) PCT Filed: Jul. 25, 2013

(86) PCT No.: PCT/US2013/051996
§ 371 (c)(1),
(2) Date: Jan. 29, 2015

(87) PCT Pub. No.: WO2014/025542
PCT Pub. Date: Feb. 13, 2014

(65) Prior Publication Data
US 2015/0264482 A1 Sep. 17, 2015

Related U.S. Application Data

(60) Provisional application No. 61/680,085, filed on Aug. 6, 2012.

(51) Int. Cl.
*H04R 25/00* (2006.01)
*H04R 3/04* (2006.01)
(Continued)

(52) U.S. Cl.
CPC ............... *H04R 3/04* (2013.01); *H03G 9/025* (2013.01); *H04R 1/10* (2013.01); *H04R 25/00* (2013.01); *H04R 25/353* (2013.01)

(58) Field of Classification Search
CPC ............................. H03G 9/025; H04R 25/356
See application file for complete search history.

(56) References Cited

U.S. PATENT DOCUMENTS 4,882,762 A 11/1989 Waldhauer
4,887,299 A 12/1989 Cummins et al.
(Continued)

OTHER PUBLICATIONS

Kahrs et al., Applications of Digital Signal Processing to Audio and Acoustics, 2002, Kluwer Academic Publishers, pp. 261-263.*
(Continued)

*Primary Examiner* — Curtis Kuntz
*Assistant Examiner* — Ryan Robinson
(74) *Attorney, Agent, or Firm* — Mueting, Raasch & Gebhardt, P.A.

(57) ABSTRACT

Method and systems (e.g., for use in hearing aids, IAPs, etc) to process an audio signal include receiving an audio signal input; separating the audio signal input into a plurality of frequency bands; and compressing each of the plurality of frequency bands. Compressing each respective frequency band of the plurality of frequency bands may include applying a time-varying gain to each respective frequency band based on a suppressive level for the respective frequency band resulting in a compressed respective frequency band (e.g., wherein the suppressive level for the respective frequency band is dependent on the audio signal input level of one or more frequency bands adjacent to the respective frequency band to which the gain is applied). The compressed respective frequency bands may be combined for use in providing an audio signal.

24 Claims, 15 Drawing Sheets

(51) Int. Cl.
*H03G 9/02* (2006.01)
*H04R 1/10* (2006.01)

(56) References Cited

U.S. PATENT DOCUMENTS

| | | | |
|---|---|---|---|
| 5,027,410 A | 6/1991 | Williamson et al. | |
| 5,278,912 A | 1/1994 | Waldhauer | |
| 6,104,822 A * | 8/2000 | Melanson | H04R 25/453 |
| | | | 381/312 |
| 6,732,073 B1 * | 5/2004 | Kluender | G10L 15/02 |
| | | | 704/200.1 |
| 6,873,709 B2 * | 3/2005 | Hou | H04R 3/00 |
| | | | 381/106 |
| 7,123,732 B2 * | 10/2006 | Roeck | H03G 7/00 |
| | | | 381/320 |
| 8,045,379 B2 * | 10/2011 | Jin | H01L 21/823807 |
| | | | 365/185.05 |
| 8,045,739 B2 * | 10/2011 | Paludan-Mueller | H04R 25/356 |
| | | | 381/106 |
| 8,085,960 B2 * | 12/2011 | Alfsmann | H04R 25/50 |
| | | | 381/320 |
| 8,175,283 B2 * | 5/2012 | Stoop | H04R 25/356 |
| | | | 381/28 |
| 8,213,653 B2 * | 7/2012 | Von Buol | H04R 25/356 |
| | | | 381/104 |
| 8,913,768 B2 * | 12/2014 | Kates | H04R 25/505 |
| | | | 381/312 |
| 8,924,220 B2 * | 12/2014 | Hosokawa | H03G 9/025 |
| | | | 341/50 |
| 2005/0111683 A1 | 5/2005 | Chabries et al. | |
| 2012/0134522 A1 | 5/2012 | Jenison et al. | |

OTHER PUBLICATIONS

International Report on Patentability for PCT Application No. PCT/US2013/051996, Feb. 19, 2015, 9 pgs.
International Search Report & Written Opinion for PCT Application No. PCT/US2013/051996, Nov. 7, 2013, 13 pgs.
Abdala, "A developmental study of distortion product otoacoustic emission (2f1-f2) suppression in humans," *Hearing Research*, Jul. 1998; vol. 121: 125-138.
Allen et al., "Loudness growth in 1/2-octave bands (LGOB)—A procedure for the assessment of loudness," *J. Acoust. Soc. Amer.*, 1990; vol. 88(2): 745-753.
Allen, "Derecruitment by multiband compression in hearing aids," in *Modeling Sensorineural Hearing Loss*, W Jesteadt, Ed. Hillsdale: Lawrence Erlbaum, 1997, pp. 99-112.
Al-Salim et al., "Reliability of categorical loudness scaling and its relation to threshold," *Ear and Hearing*, Aug. 2010; vol. 31(4): 567-578.
Arthur et al., "Properties of 'two-tone inhibition' in primary auditory neurons," *J. Physiol.*, Feb. 1971: vol. 212(5): 593-609.
Bhattacharya and F. G. Zeng, "Companding to improve cochlear-implant speech recognition in speech-shaped noise," *J. Acoust. Soc. Am.*, 2007; vol. 122(2): 1079-1089.
Birkholz et al., "Growth of suppression using distortion-product otoacoustic emission measurements in hearing-impaired humans," *J. Acoust. Soc. Am.*, 2012; vol. 132(5): 3305-3318.
Brand and V. and Hohmann, "An adaptive procedure for categorical loudness scaling," *J. Acoust. Soc. Am.*, 2002; vol. 112(4): 1597-1604.
Brand, "Loudness Scaling," 8$^{th}$ EFAS Congress/10$^{th}$ Congress of the German Society of Audiology, Jun. 6-9, 2007, Heidelberg, Germany, 7 pages.
Byrne et al., "NAL-NL1 procedure for fitting nonlinear hearing aids: Characteristics and comparisons with other procedures," *J. Amer. Acad. Audiol.*, 2001; vol. 12:37-51.
Cornelisse et al., "The input/output formula: A theoretical approach to the fitting of personal amplification devices," *J. Acoust. Soc. Am.*, 1995; vol. 97(3): 1854-1864.

Cox, "Using loudness data for hearing aid selection: The IHAFF approach," *Hear. J.*, 1995; vol. 48(2): 39-42.
Delgutte, "Two-tone rate suppression in auditory-nerve fibers: Dependence on suppressor frequency and level," *Hearing Research*, Nov. 1990, vol. 49(1-3): 225-246.
Duifhuis, "Level effects in psychophysical two-tone suppression," *J. Acoust. Soc. Amer.*, 1980; vol. 67(3): 914-927.
Elberling, "Loudness scaling revisited," *J. Am. Acad. Audiol.*, 1999; vol. 10: 248-260.
Gordon-Salant, "Recognition of natural and time/intensity altered CVs by young and elderly subjects with normal hearing," *J. Acoust. Soc. Am.*, 1986; vol. 80(6): 1599-1607.
Gorga et al., "The use of distortion product otoacoustic emission suppression as an estimate of response growth," *J. Acoust. Soc. Am.*, 2002; vol. 111(1): 271-284.
Gorga et al., "Growth of suppression in humans based on distortion-product otoacoustic emission measurements," *J. Acoust. Soc. Am.*, 2011a; vol. 129(2): 801-816.
Gorga et al., "Distortion-product otoacoustic emission suppression tuning curves in humans," *J. Acoust. Soc. Am.*, 2011b; vol. 129(2): 817-827.
Härmä. Derivation of the complex-valued gammatone filters. Apr. 13, 1999. [Online at //www.acoustics.hut.fi/software/HUTear/Gammatone/Complex_gt.html]; 7 pgs.
Herzke and V. Hohmann, "Improved Numerical Methods for Gammatone Filterbank Analysis and Synthesis," *Acta. Acust. Acust.*, 2007; vol. 93:498-500.
Herzke and V. Hohmann, "Effects of Instantaneous Multiband Dynamic Compression on Speech Intelligibility," *EURASIP J. Adv. Signal Process*, 2005; vol. 18: 3034-3043.
Hohmann, "Frequency analysis and synthesis using a gammatone filterbank," *Acta. Acust. Acust.*, 2002; vol. 88: 433-442.
ISO, "Acoustics—Normal equal-loudness-level contours," ISO, 226, 2003, 24 pages.
ISO, "Acoustics—Loudness scaling by means of categories," ISO, 16832, 2006, 17 pages.
Jepsen et al., "A computational model of human auditory signal processing and perception," *J. Acoust. Soc. Am.*, 2008; vol. 124(1): 422-438.
Kates, "Digital Hearing Aids," *Plural Publishing*, 2008:52-53.
Kates et al., "The Hearing-Aid speech Quality Index (HASQI)", *J Audio Engl. Soc.*, May 2010;Vo. 58(5): 363-381.
Keefe et al., "Two-tone suppression of stimulus frequency otoacoustic emissions," *J. Acoust. Soc. Am.*, 2008; vol. 123(3):1479-1494.
Lopez-Poveda et al., "A variant temporal-masking-curve method for inferring peripheral auditory compression," J. Acoust. Soc. Am., Mar. 2008; 123(3):1544-1554.
Meddis et al. "A computational algorithm for computing nonlinear auditory frequency selectivity," *J. Acoust. Soc. Am.*, 2001; vol. 109:2852-2861.
Moore et al., "The role of spread excitation and suppression in simultaneous masking," *J. Acoust. Soc. Am.*, Oct. 1997; vol. 102(4): pp. 2284-2290.
Moore and C. T. Tan, "Perceived naturalness of spectrally distorted speech and music," *J. Acoust. Soc. Am.*, 2003; vol. 114(1): 408-419.
Oxenham et al., "Evaluation of companding-based spectral enhancement using simulated cochlear-implant processing," *J. Acoust. Soc. Am.*, 2007; vol. 121(3): 1709-1716.
Patterson and J. Holdsworth, "A functional model of neural activity patterns and auditory images," in *Advances in Speech, Hearing and Language Processing*, A. W. Ainsworth, Ed. London: JAI Press, 1996, pp. 547-563.
Peterson and H. L. Barney, "Control methods used in a study of the vowels," *J. Acoust. Soc. Am.*, 1952; vol. 24: 175-184.
Rasetshwane et al., "Enhancement of speech intelligibility using transients extracted by wavelet packets," in *IEEE Workshop on Applications of Signal Processing to Audio and Acoustics*, New Paltz, 2009, pp. 173-176.
Rhode and L. Robles, "Evidence from Mössbauer experiments for nonlinear vibration in the cochlea," *J. Acoust. Soc. Am.*, 1974; vol. 55(3):588-596.

(56) References Cited

OTHER PUBLICATIONS

Rhode and N. P. Cooper, "Two-tone suppression and distortion production on the basilar membrane in the hook region of cat and guinea pig cochleae," *Hearing Research*, Mar. 1993; vol. 66(1): 31-45.

Rodríguez and S. T. Neely, "Temporal aspects of suppression in distortion-product otoacoustic emissions," *J. Acoust. Soc. of Am.*, 2011; vol. 129(5): 3082-3089.

Rodríguez et al., "The role of suppression in psychophysical tone-on-tone masking," *J. Acoust. Soc. Am.*, Jan. 2009; vol. 127(1): 361-369.

Ruggero et al., "Two-Tone Suppression in the basilar membrane of the cochlea: mechanical basis of auditory-nerve rate suppression," *J. Neurophysiol*, Oct. 1, 1992: vol. 68(4): 1087-1099.

Sachs and N. Y. S. Kiang, "Two-tone inhibition in auditory-nerve fibers," *J. Acoust. Soc. Am.*, May 1968; vol. 43(5):1120-1128.

Sachs and E. D. Young, "Effects of nonlinearities on speech encoding in the auditory nerve," *J. Acoust. Soc. Am.*, Mar. 1980;68(3): 858-875.

Scharf, "Loudness," in *Handbook of Perception*: vol. IV. *Hearing*, E. C. Carterette and M. P. Friedman, Eds. New York: Academic Press, 1978, pp. 187-242.

Schmiedt, "Acoustic injury and the physiology of hearing," *J. Acoust. Soc. Am.*, 1984; vol. 76(5): 1293-1317.

Shera et al., "Otoacoustic estimation of cochlear tuning: Validation in the chinchilla," *J. Assoc. Res. Otolaryngol.*, Sep. 2010; vol. 11(3): 343-365.

Stone and B. C. J. Moore, "Spectral feature enhancement for people with sensorineural hearing impairment: Effects on speech intelligibility and quality," *J. Rehabil. Res. Dev.*, 1992; vol. 29(2):39-56.

Stone et al., "Tolerable hearing aid delays. V. Estimation of limits for open canal fittings," *Ear and Hearing*, Aug. 2008; vol. 29(4): 601-617.

Strelcyk et al., "Restoration of loudness summation and differential loudness growth in hearing-impaired listeners," *J. Acoust. Soc. Am.*, 2012; vol. 132(4): 2557-2568.

Turicchia and R. Sarpeshkar, "A bio-inspired companding strategy for spectral enhancement," *IEEE Trans. Speech Audio Process.*, Mar. 2005; vol. 13(2): 243-253.

Weber, "Do off-frequency simultaneous maskers suppress the signal?" *J. Acoust. Soc. Am.*, 1983; vol. 73(3): 887-893.

Yasin et al., "The role of suppression in the upward spread of masking," *J. Assoc. Res. Otolaryngol.*, Dec. 2005; vol. 6(4): 368-377.

Zettner and R. C. Folsom, "Transient emission suppression tuning curve attributes in relation to psychoacoustic threshold," *J. Acoust. Soc. Am.*, 2003; vol. 113(4): 2031-2041.

\* cited by examiner

TABLE I
SPECTRAL CONTRAST ENHANCEMENT (SCE) FOR FIVE SYNTHETIC VOWELS
SPOKEN BY MALE AND FEMALE SPEAKERS

| Vowel | Speaker | $F_0, F_1, F_2, F_3$ (Hz) | SCE (dB) Comp | SCE (dB) Supp |
|---|---|---|---|---|
| /i/ | Male | 136, 270, 2290, 3010 | -1.23 | 1.98 |
| /ɪ/ | Male | 135, 390, 1990, 2550 | 1.09 | 5.08 |
| /ɛ/ | Male | 130, 530, 1840, 2480 | 0.14 | 3.63 |
| /ɑ/ | Male | 124, 730, 1090, 2440 | 0.28 | 1.74 |
| /u/ | Male | 141, 300, 870, 2240 | -4.07 | -0.09 |
| /i/ | Female | 235, 310, 2790, 3310 | -2.93 | -1.25 |
| /ɪ/ | Female | 232, 430, 2480, 3070 | -3.64 | 0.94 |
| /ɛ/ | Female | 223, 610, 2330, 2990 | 0.34 | 1.57 |
| /ɑ/ | Female | 212, 850, 1220, 2810 | -1.73 | 2.47 |
| /u/ | Female | 231, 370, 950, 2670 | 0.25 | 1.72 |
| Mean | | | -1.15 | 1.78 |

MULTIBAND AUDIO COMPRESSION SYSTEM AND METHOD

CROSS REFERENCE TO RELATED APPLICATIONS

This application is the §371 U.S. National Stage of International Application No. PCT/US2013/051996, filed 25 Jul. 2013, which claims the benefit of U.S. Provisional Application Ser. No. 61/680,085 filed 6 Aug. 2012, entitled "Multiband Audio Compression System and Method" which are incorporated herein by reference in their entireties.

STATEMENT REGARDING FEDERALLY SPONSORED RESEARCH OR DEVELOPMENT

This invention was made with government support under R01 DC008318 awarded by National Institute of Health (NIH). The government has certain rights in this invention.

BACKGROUND

The present disclosure pertains generally to audio compression systems and methods, e.g., for use in hearing aids, implantable auditory prostheses (IAPs), etc.

Various techniques have been described for processing audio signals, such as in U.S. Pat. No. 4,882,762 issued Nov. 21, 1989 entitled "Multi-band programmable compression system"; U.S. Pat. No. 5,278,912 issued Jan. 11, 1994 entitled "Multiband programmable compression system"; U.S. Pat. No. 4,887,299 issued Dec. 12, 1989 entitled "Adaptive, programmable signal processing hearing aid"; U.S. Pat. No. 5,027,410 issued Jun. 25, 1991 entitled "Adaptive, programmable signal processing and filtering for hearing aids"; and U.S. Pat. No. 6,873,709 issued Mar. 29, 2005 entitled "Method and apparatus for filtering and compressing sound signals". However, there is always a need for improved compression functionality.

SUMMARY

One exemplary embodiment of a method of processing an audio signal (e.g., such as for use in hearing aid devices, implantable auditory prostheses (IAPs), etc.) may include receiving an audio signal input, separating the audio signal input into a plurality of frequency bands, and compressing each of the plurality of frequency bands. Compressing each respective frequency band of the plurality of frequency bands may include applying a time-varying gain to each respective frequency band based on a suppressive level for the respective frequency band resulting in a compressed respective frequency band (e.g., the suppressive level for the respective frequency band may be dependent on the audio signal input level of one or more frequency bands adjacent to the respective frequency band to which the gain is applied). The method may further include combining the compressed respective frequency bands for use in providing an audio signal output.

One exemplary embodiment of a compression system (e.g., such as for use in hearing aid devices, implantable auditory prostheses (IAPs), etc.) may include an audio signal input and processing apparatus configured to separate the audio signal input into a plurality of frequency bands and further configured to compress each of the plurality of frequency bands. Compressing each respective frequency band of the plurality of frequency bands may include applying a time varying gain to each respective frequency band based on a suppressive level for the respective frequency band resulting in a compressed respective frequency band (e.g., the suppressive level for the respective frequency band may be dependent on the audio signal input level of one or more frequency bands adjacent to the respective frequency band to which the gain is applied). Further, the processing apparatus may be configured to combine the compressed respective frequency bands for use in providing an audio signal output.

One embodiment of an exemplary hearing aid system may include an input transducer apparatus configured to convert a sound pressure signal to an audio signal input and processing apparatus configured to separate the audio signal input into a plurality of frequency bands, and further configured to compress each of the plurality of frequency bands. Compressing each respective frequency band of the plurality of frequency bands may include applying a time-varying gain to each respective frequency band based on a suppressive level for the respective frequency band resulting in a compressed respective frequency band (e.g., the suppressive level for the respective frequency band is dependent on the audio signal input level of one or more frequency bands adjacent to the respective frequency band to which the gain is applied). Further, the processing apparatus may be configured to combine the compressed respective frequency bands for use in providing an audio signal output. The hearing aid system may further include an output transducer apparatus configured to provide a sound pressure signal based on the audio signal output.

In one or more exemplary systems or methods, applying a time-varying gain to each respective frequency band based on a suppressive level for the respective frequency band may include determining the suppressive level for the respective frequency band using equations based on normal two-tone suppression for the respective frequency band.

In one or more exemplary systems or methods, the signal of one or more of the respective frequency bands may be delayed by an amount that varies based on the suppressive level for the respective frequency band.

In one or more exemplary systems or methods, separating the audio signal input into a plurality of frequency bands may include separating the audio signal input into a plurality of contiguous frequency bands. Further, for example, the suppressive level for the respective frequency band may be dependent on the instantaneous audio signal input level of one or more frequency bands adjacent to the respective frequency band to which the gain is applied.

In one or more exemplary systems or methods, the suppressive level for the respective frequency band may be a logarithmic transformation of a suppressive intensity of the one or more frequency bands adjacent to the respective frequency band to which the gain is applied. For example, the suppressive intensity may be the sum of a plurality of channel-specific suppressive intensities corresponding to a plurality of frequency bands adjacent to the respective frequency band. Further, for example, each of the channel-specific suppressive intensities may have exponents that are linear functions of the audio signal input level of the corresponding frequency band of the plurality of frequency bands.

In one or more exemplary systems or methods, the time-varying gains for the respective frequency bands may be piecewise-linear functions of the suppressive level.

In one or more exemplary systems or methods, the time-varying gain applied to each respective frequency band based on a suppressive level for the respective frequency band may be a constant gain when the suppressive level is below a specified compression-start level, may be a constant gain above a specified compression-end level, and, at intermediate levels between the compression-start level and compression-end level, the gain may decrease as a linear function of the suppressive level. For example, the compression-start level for each frequency band may be a sound pressure level perceived as "very soft" by normal-hearing ears and the gain applied at this compression-start level may be based on the excess sound pressure level required by a hearing-impaired individual for "very-soft" perception. Further, for example, the compression-start level for each frequency band may be a sound pressure level at the threshold of hearing a tone for normal-hearing ears and the gain applied at this compression-start level may be based on the excess sound pressure level required by a hearing-impaired individual for the same tone threshold. Still further, for example, the compression-end level for each frequency band may be a sound pressure level perceived as "very loud" by normal-hearing ears and the gain applied at this compression-end level may be based on the excess sound pressure level required by a hearing-impaired individual for "very-loud" perception.

In one or more exemplary systems or methods, the signal of one or more of the respective frequency bands may be delayed by an amount that varies based on the suppressive level for the respective frequency band. Such delay added may be constant below the compression-start level, the delay may be zero above the compression-end level, and the delay may be a decreasing function at intermediate suppressor levels.

In one or more exemplary systems or methods, the suppressive level for each respective frequency band may be about equal to instantaneous audio signal level of the respective frequency band. Still further, in one or more exemplary systems or methods, applying the time-varying gain to each respective frequency band may include applying a time-varying gain at a plurality of sequential times based on a suppressive level for the respective frequency band determined using equations based on normal two-tone suppression for the respective frequency band (e.g., the time-varying gain at intermediate time steps between adjacent sequential times may be linearly interpolated between the adjacent sequential times).

In one or more exemplary systems or methods, the audio signal input may include a complex valued input signal including both amplitude and phase components, the bandwidths of the plurality of frequency bands may be contiguous and sized such that high frequency delay is 5 milliseconds or less, the methods/systems may include applying frequency specific time and phase adjustments to the audio signal input to cause the audio signal output to move towards a flatter delay across the entire range of audible frequencies, and/or frequency-specific time and phase adjustments may be applied to the input signal to improve the preservation of transient signals by causing the summed output of the suppressor to have the flattest possible delay across the entire range of audible frequencies.

The above summary is not intended to describe each embodiment or every implementation of the present disclosure. A more complete understanding will become apparent and appreciated by referring to the following detailed description and claims taken in conjunction with the accompanying drawings.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION OF EXEMPLARY EMBODIMENTS

Figure 1:
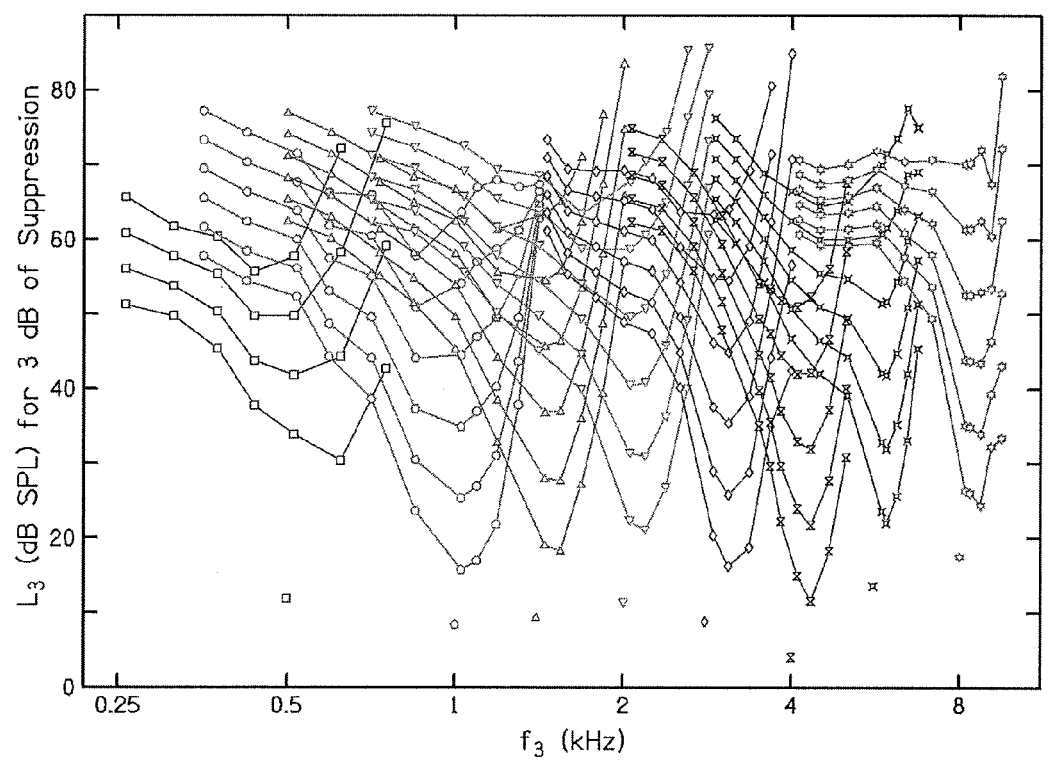
FIG. 1 shows DPOAE suppression tuning curves for various frequencies including $f_2=1$, 2, 4 and 8 kHz from Gorga et al (2011). The parameter in this figure is $f_2$ (circles=1 kHz, downward triangles=2 kHz, hourglasses=4 kHz, and stars=8 kHz). $L_2$ ranged from 10 dB SL (lowest STC) to 60 dB SL (highest STC). The unconnected symbols below each set of STCs represent the mean behavioral thresholds for the group of subjects contributing data at that frequency.

In the following detailed description of illustrative embodiments, reference is made to the accompanying figures of the drawing which form a part hereof, and in which are shown, by way of illustration, specific embodiments which may be practiced. It is to be understood that other embodiments may be utilized and structural changes may be made without departing from (e.g., still falling within) the scope of the disclosure presented hereby.

Exemplary methods, apparatus, and systems shall be described with reference to FIGS. 1-20. It will be apparent to one skilled in the art that elements or processes from one embodiment may be used in combination with elements or processes of the other embodiments, and that the possible embodiments of such methods, apparatus, and systems using combinations of features set forth herein is not limited to the specific embodiments shown in the Figures and/or described herein. Further, it will be recognized that the embodiments described herein may include many elements that are not necessarily shown to scale. Still further, it will be recognized that timing of the processes and the size and shape of various elements herein may be modified but still fall within the scope of the present disclosure, although certain timings, one or more shapes and/or sizes, or types of elements, may be advantageous over others.

Figure 15:
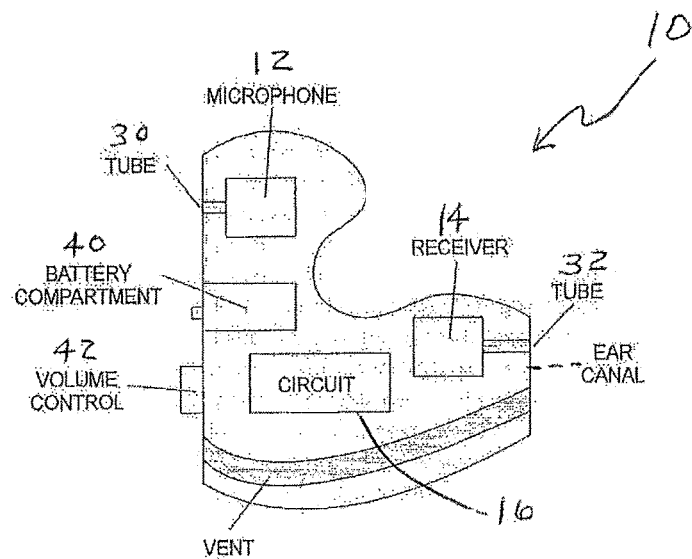
FIG. 15 shows a cross section of one exemplary embodiment of an in-the-ear (ITE) style hearing aid, along with exemplary components thereof including a sound-input transducer (MICROPHONE), sound-output transducer (RECEIVER), and signal processor (CIRCUIT).
Figure 16:
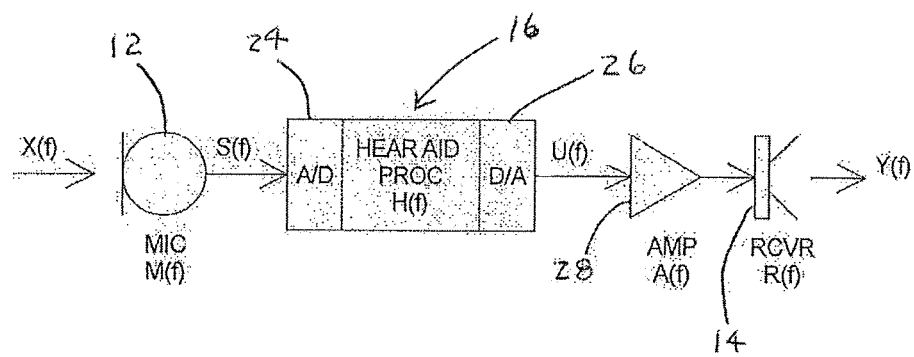
FIG. 16 is a block diagram of one exemplary embodiment of a hearing aid device showing an exemplary hearing-aid processing unit (PROC), along with other exemplary components thereof including an analog-to-digital convertor (A/D), digital-to-analog convertor (D/A), microphone (MIC), amplifier (AMP), and receiver (RCVR). Various embodiments that may be modified as described herein are provided in the textbook "Digital Hearing Aids" by James M. Kates (2008, Plural Publishing) pp. 52-53.

FIG. 15 shows a cross section of one exemplary embodiment of an in-the-ear (ITE) style hearing aid 10, along with exemplary components thereof including a sound-input transducer 12 (MICROPHONE), sound-output transducer 14 (RECEIVER), and signal processor 16 (CIRCUIT). FIG. 16 is a block diagram of one exemplary embodiment of a hearing aid device showing an exemplary hearing-aid processing unit 16 (PROC), along with other exemplary components thereof including an analog-to-digital convertor 24 (A/D), digital-to-analog convertor 26 (D/A), microphone 12 (MIC), amplifier 28 (AMP), and receiver 14 (RCVR). FIGS. 15-16 show an exemplary embodiment of a hearing aid device that may use the signal processing described herein (e.g., a conventional device modified to carry out the compression processes described herein). For general information on conventional hearing aid functionality, see the textbook "Digital Hearing Aids" by James M. Kates (2008, Plural Publishing), pp. 52-53. It will be recognized that any hearing aid device, and clearly not only the exemplary embodiments shown herein, may utilize and/or have processor capabilities configured (e.g., programmed) to implement the signal processing described herein (e.g., the compression techniques based at least in part on suppression). Although an ITE device is shown in FIG. 15, it will be recognized that any other type of hearing aid device may benefit from such processing, including, but clearly not limited to, behind-the-ear (BTE) hearing aids, in-the-canal (ITC) hearing aids, portable assistive listening devices, garment wearable devices, implantable auditory prostheses, etc. Further, other devices, in addition to hearing aid devices, may benefit from such processing, including, for example, speech recognition devices, spectrographic display devices, audio dynamic-range-compression devices, etc.

As shown in FIGS. 15-16, the hearing aid device 10 including a programmable processing apparatus 16 (CIRCUIT) receives an audio signal X(f) with an input transducer apparatus 12 (e.g., MIC or MICROPHONE 12 via a TUBE 30 in the hearing aid device 10) to, for example, convert a sound pressure signal X(f) to an audio signal input S(f). The output S(f) of the microphone or input transducer apparatus 12 is coupled to circuitry 16 (e.g., CIRCUIT) for manipulation thereof. The circuitry may include various components, such as pre-amplifiers, automatic gain control circuits, analog-to-digital (A/D) convertors, digital to analog (D/A) convertors, processors and/or control circuits, filters (e.g., band split filters), amplifiers, feedback-suppression circuits, noise-reduction circuits, sound-classification circuits, etc.

As shown in FIG. 16, in one exemplary embodiment, the output S(f) of the microphone or input transducer apparatus is coupled to an analog-to-digital (A/D) convertor 24 such that the digital signal processing may be performed on the digital signal resulting therefrom. Hearing aid processing circuitry 16 then performs digital signal processing thereon (e.g., such as the digital signal processing described herein with reference to FIG. 4 which may be implemented by the processing circuitry 16 (e.g., HEAR AID PROC (H(f)))). The resulting output is then converted by a digital to analog (D/A) convertor 26 to an analog signal (e.g., U(f)). The signal U(f) may then be amplified (e.g., AMP (A(f)) 28) and provided to an output transducer apparatus 14 (e.g., RCVR (R(f)) or speaker) configured to provide a sound pressure signal to the ear canal (e.g., Y(f) via a TUBE 32 coupled thereto). For example, the processing circuitry 16 may include filter circuitry configured to separate the audio signal input into a plurality of frequency bands and, thereafter, the processing circuitry 16 may be configured to compress each of the plurality of frequency bands (e.g., the filtering may be performed as part of the same signal processing apparatus that performs compression functionality or apart therefrom; the listing of them separately herein only refers to a separate function being perform and not necessarily what circuitry performs such functions). Compressing each respective frequency band of the plurality of frequency bands may include applying a time-varying gain to each respective frequency band based on a suppressive level for the respective frequency band resulting in a compressed respective frequency band. The suppressive level for the respective frequency band may be dependent on the audio signal input level of one or more frequency bands adjacent to the respective frequency band to which the gain is applied. Further, the processing apparatus 16 may be configured to combine (e.g., using a summing circuit) the compressed respective frequency bands (e.g., a composite signal) for use in providing an audio signal output.

The hearing aid device 10 shown in FIGS. 15-16 further includes a power source 40 (e.g., within a BATTERY COMPARTMENT) along with any other necessary voltage regulator circuitry or other power circuitry for operation of the device. As will be appreciated in the art, the programmable processing circuitry 16 including the compression functionality may be adapted for implementation on an integrated circuit and all of the circuits enclosed in an area of the hearing aid device (e.g., may be constructed on a single integrated circuit substrate). The hearing aid may be powered by a single cell, low voltage battery. Further, a volume control feature 42 (e.g., VOLUME CONTROL) may be implemented as would be known in the art.

Further, the programmable processing circuitry may be adapted to receive a plurality of control signals which may be generated by an external control circuit. The external control circuit may be coupled to any one or more components of the hearing aid device. The control signals generated by external control circuit may be adapted, for example, to control the frequency band separation used, the gain applied, the compression start and end points, etc. to generate a desired response for the hearing aid to compensate for hearing impairment.

An exemplary embodiment of an audio signal compression system (e.g., a multiband audio dynamic-range compressor usable in a hearing aid device as described herein or any other device that may benefit from such signal processing) may include a time-varying gain in each of its frequency bands that simulates the influence of two-tone suppression as observed in normal human ears. In one or more embodiments, the compressor may be used in a hearing-aid device in conjunction with a filterbank that splits a wideband audio signal into a plurality of contiguous frequency bands. For example, the time-varying gain applied to each frequency band is based on a suppressive level for that band. The calculation of suppressive level may be modeled on measurements of human two-tone suppression (e.g., such as presented herein) and may be dependent on the instantaneous audio level in a plurality of adjacent frequency bands. In one or more embodiments, the compressor may apply maximum gain to low-level sounds and minimum gain to high-level sounds in a manner that restores normal perception of loudness to an ear with hearing loss. One or more of the compressor embodiments may have the advantage over other multiband compressors in that they may be more similar to the human ear in its inclusion of cross-channel suppression, which avoids excessively rapid loudness growth while maintaining informative spectral contrasts. Without suppression, the restoration of normal loudness to an ear with hearing loss may not be possible.

The primary sensory organ for hearing is the cochlea. Three major signal-processing functions of the cochlea are (1) frequency separation or analysis, (2) dynamic-range compression (DRC), and (3) amplification. The cochlea implements these functions in a concurrent manner that does not allow completely separate characterization of each function. Common forms of hearing loss are associated with impairment of these signal-processing functions. Whenever hearing loss includes loss of DRC, the application of simple, linear gain in an external hearing aid may not restore normal perception of acoustic signals.

An important by-product of DRC is suppression, which contributes to psychophysical simultaneous masking (e.g., see Moore et al. (1997); Yasin et al. (2005); Rodriguez et al. (2009)). As indicated herein two-tone suppression may refer to a non-linear property of healthy cochleae in which the response (e.g., basilar-membrane displacement and/or neural-firing rate) to a particular frequency is reduced by the simultaneous presence of a second tone at a different frequency (e.g., see Ruggero et al. (1992); Rhode et al. (1993); Delgutte (1990); Sachs et al. (1968)). Because these invasive measurements cannot be made in humans, suppression must be estimated by other physiological or psychophysical procedures (e.g., see Duifhuis (1980); Weber (1983); Abdala (1998); Gorga (2002); Gorga (2011)). Distortion product otoacoustic emission (DPOAE) suppression is one of these procedures and can be used to provide a description of the specific suppressive effect of one frequency on another frequency (e.g., see Abdala (1998) and Gorga (2011)).

Suppression plays a role in the coding of speech and other complex stimuli (e.g., see Sachs et al. (1980)), and may result in enhancement of spectral contrast of complex sounds, such as vowels (e.g., see Turicchia et al. (2005) and Oxenham et al. (2007)). This enhancement of spectral contrasts may improve speech perception in the presence of background noise (e.g., see Oxenham et al. (2007); Bhattacharya et al. (2007); Stone et al. (1992)).

Sensory hearing loss is defined by elevated threshold due to disruption of the major signal-processing functions of the cochlea. Two-tone suppression is usually reduced in ears with sensory hearing loss (e.g., see Schmiedt (1984) and Birkholz (2012)). These ears typically also present with loudness recruitment, a phenomenon where the rate of growth of loudness with increasing sound level is more rapid than normal (e.g., see Al-Salim et al. (2010) and Scharf (1978)).

Multiband DRC hearing-aids attempt to restore DRC but currently do not attempt to restore normal suppression. DRC alone (i.e., without suppression) may reduce spectral contrasts by reducing gain for spectral peaks while providing greater gain for spectral troughs. The hearing-aid device signal-processing strategy described herein aims to restore normal cochlear two-tone suppression, with at least one expectation being that this would improve spectral contrasts for signals such as speech. The implementation of suppression in this strategy was at least partly based upon measurements of DPOAE suppression tuning curves (STC) (see Gorga et al. (2011)). The processes of DRC, amplification and suppression are not implemented separately in at least one embodiment of this strategy, but may be unified into a single operation. The prescription of amplification for the method is based on measurements of categorical loudness scaling (CLS) for tones (e.g., see Al-Salim et al. (2010) and Brand et al. (2002)), and is intended to restore normal growth of loudness for any type of signal. At least one embodiment of the strategy is computationally efficient and could be implemented using current hearing-aid technology (with modifications thereto) to restore both normal suppression and normal loudness growth. Restoration of normal suppression may lead to increased hearing-aid user satisfaction and possibly improved speech perception in the presence of background noise. Restoring individualized loudness growth, on the other hand, may increase the usable dynamic range for persons with sensory hearing loss.

DPOAE-STCs of Gorga et al. provide a comprehensive description of the specific suppressive effect of one frequency on another frequency (see Gorga et al. (2011)). These measurements provide a basis for the suppression component of the signal-processing strategy described herein. Use of DPOAE-STC measurements in the calculation of gain allows for at least one implementation of two-tone suppression.

Al-Salim et al. described a method to determine the level-dependent gain that a hearing-impaired (HI) listener needs in order to have the same loudness percept for tones as a normal-hearing (NH) listener (see Al-Salim et al. (2010)). These data, based on CLS, provide a basis of at least one of the amplification-prescription strategies described herein. Specifically, at least one embodiment of the strategy described herein aims to provide frequency- and level-dependent gain to a HI listener such that a sound that is perceived as "very soft" by a NH listener is also perceived as "very soft" by a HI listener, and a sound that is perceived as "very loud" by a NH listener is also perceived as "very loud" by a HI listener. The idea is to maximize audibility for low-level sounds while at the same time avoiding loudness discomfort at high levels. The hearing-aid fitting strategy may require CLS data at several frequencies for each HI listener. In order to quantify the deviation from normal, average CLS data for NH listeners may also be required. Providing frequency- and level-dependent gain allows for the relative loudness of individual frequency components of complex sounds like speech to be preserved after amplification. The goal of restoring normal loudness growth is in contrast to other commonly-used hearing aid fitting strategies that use loudness measures only to prescribe a maximum hearing-aid output that avoids loudness discomfort (e.g., see Byrne et al. (2001) and Cornelisse et al. (1995)). Another difference between one or more of the fitting strategies described herein and other current fitting methods is that such strategy does not need to use audiometric thresholds, a model of loudness, or a model of speech intelligibility, but may use instead actual CLS data from each HI individual.

At least one embodiment of signal-processing strategy described herein is motivated by the goals of restoring normal cochlear two-tone suppression and normal loudness growth. The strategy may use a filter-bank to decompose an input signal into multiple channels and a model of two-tone suppression to apply time-varying gain to the output of each channel before subsequently summing these channel outputs. The time-varying gain may be designed to implement DRC, amplification and suppression that mimics the way the cochlea performs these functions. In such embodiments, these processes are not implemented separately, but concurrently in a unified operation. The gain applied to a particular channel may be a function of the levels of all the filter-bank channels, and not just that channel. The gains may be determined by formulas based on (1) the DPOAE STC measurements of Gorga et al. and (2) the CLS measurements of Al-Salim et al. Suppressive effects may be applied to these gains instantaneously because measurements of the temporal features of suppression suggest that suppression is essentially instantaneous (e.g., see Rodriguez et al. (2011) and Arthur et al. (1971)).

Various portions of the description herein provide a description of the DPOAE-STC measurements and how they may be used to determine the level-dependent gain that results in two-tone suppression and a description of one or more embodiments of a signal-processing strategy. Signal-processing evaluations are provided herein to demonstrate (1) nonlinear input/output function, (2) two-tone suppression, (3) STC, and (4) spectral-contrast enhancement. Further, a description of the use of CLS data for the prescription of amplification is also provided.

The idea that an external hearing aid should restore normal loudness is not a new idea. The categorical loudness test known as LGOB was developed for fitting a new multi-band compression hearing aid (see Allen (1996); Allen (1990)). Similar loudness tests were also developed (e.g., see Cox (1995)), but it was never clear how to use the loudness data to select amplification. None of the various strategies employed have been entirely satisfactory.

For example, the following is a list of patents describing various compression systems for use in hearing aid devices: U.S. Pat. No. 4,882,762; U.S. Pat. No. 5,278,912; U.S. Pat. No. 4,887,299; U.S. Pat. No. 5,027,410; and U.S. Pat. No. 6,873,709. Each of such references is incorporated herein by reference.

Likewise, it has not been clear how to incorporate into a hearing aid the cross-frequency influences on gain that are known to be a part of normal cochlear signal processing. The problem has been the lack of any model of suppression that is both realistic, when compared to normal cochlear suppression, and realizable, within the severe time and power constraints of hearing aids. The suppression model described herein satisfies these requirements. One insight that may have made this possible was the discovery of a numerically-efficient mathematical representation of distortion-product otoacoustic emission (DPOAE) suppression data.

Because frequency components interact nonlinearly with each other inside the cochlea, the loudness growth of tones is relatively simple in comparison to the loudness growth of complex sounds. The term suppression may be used to refer to a reduction in the response growth of one tone in the presence of a second tone. Suppression is a salient feature of cochlear mechanics and is a major contributor to psychophysical simultaneous masking. Suppression is evident in measurements of distortion-product otoacoustic emissions (DPOAEs) in subjects with normal hearing and subjects with mild-to-moderate hearing loss. A time-domain model of suppression has been implemented by applying time-varying gain to each output of a gammatone filter-bank before subsequently summing these outputs. Simulated suppression thresholds plotted as a function of suppressor frequency resemble measured DPOAE suppression tuning curves. Our approach to simulating cochlear suppression may be applied using innovative signal-processing strategies that are useful in the design of hearing aids, and other hearing aid devices (e.g., IAPs, etc.).

One or more embodiments of a hearing-aid signal-processing strategy described herein aims to restore both loudness growth and two-tone suppression in hearing-impaired listeners. The prescription of gain for this strategy is based on measurements of loudness by a method known as categorical loudness scaling. In at least one embodiment, the proposed signal-processing strategy reproduces measured DPOAE suppression tuning curves and generalizes to any number of frequency components. The restoration of both normal suppression and normal loudness may improve hearing-aid performance and user satisfaction.

An exemplary signal processing simulation of cochlear two-tone suppression is described herein with reference to FIGS. 1-14 and 17-20. A multiband suppressor for compressing an input signal that includes a plurality of frequency-specific audio signals through the application of time-varying gains for each frequency band that are based on the suppressive level of the input signal is based at least in part on the suppression modeling described therein. For example, the suppressive level is calculated from the set of instantaneous sound levels associated with the input signal according to equations that describe normal human two-tone suppression (e.g., for example, Equations 5-6 herein).

For example, in the suppressor described herein, the input signal may be complex valued, i.e., having both amplitude and phase, to facilitate the calculation of the set of instantaneous sound levels required by the suppressor. Further, for example, in the suppressor described herein, the bandwidths of the frequency-specific audio signals may be specified to be contiguous and sufficiently broad so as not to introduce an unacceptable delay. For example, a high-frequency delay of more than 5 milliseconds is considered to be unacceptable in a hearing aid (e.g., high frequency referring to greater than 2 kHz).

Still further, in the suppressor described herein, frequency-specific time and phase adjustments may be applied to the input signal to improve the preservation of transient signals by causing the summed output of the suppressor to have the flattest possible delay across the entire range of audible frequencies (e.g., about 100 Hz to about 12 kHz).

As described in the modeling provided herein, the suppressive level may be a logarithmic transformation of the suppressive intensity, wherein the suppressive intensity is the sum of a plurality of channel-specific intensities (e.g., the plurality of channels corresponding to the plurality of frequency bands), and wherein the channel-specific intensities may have exponents that are linear functions of the instantaneous channel levels.

Still further, the time-varying gains may be piecewise-linear functions of the suppressive levels. For example, in one or more embodiments, the gain may be constant when the suppressive level is below a specified compression-start level and constant above a specified compression-end level. At intermediate levels between the compression-start and compression-end levels, the gain may decrease as a linear function of the suppressive level.

For example, the compression-start level for each frequency band may be the sound pressure level perceived as "very soft" by normal-hearing ears. In at least one embodiment, the gain at this level may be the excess sound pressure level required by a hearing-impaired for "very-soft" perception. Further, for example, the compression-end level for each frequency band may be the sound pressure level perceived as "very loud" by normal-hearing ears. In at least one embodiment, the gain at this level may be the excess sound pressure level required by a hearing-impaired for "very-loud" perception.

Further, for example, the compression-start level for each frequency band may be the sound pressure level at the threshold of hearing a tone (e.g., in quiet) by normal-hearing ears. In at least one embodiment, the gain at this level may be the excess sound pressure level required by a hearing-impaired for the same tone threshold.

In one or more still further embodiments, the suppressive level may simply be equal to the instantaneous channel levels. In this mode, the suppressor resembles a traditional compressor, with no cross-channel suppression. This mode may offer the advantage of reduced computational load. Yet in further embodiments, the instantaneous channel levels may be down sampled, by a factor of two or more, to increase computational efficiency. In this mode, the time-varying gain at intermediate steps may be linearly interpolated between the adjacent time steps at which gain is fully calculated.

Still further, in one or more embodiments, in the suppressor described herein, the signal in each channel may be delayed by an amount that varies according to some function of suppressive level in that channel. In at least one embodiment, the added delay may be constant below the compression-start level, zero above the compression-end level, and may be a decreasing function at intermediate suppressor levels. For example, the positive delay amounts may be selected to approximately restore normal cochlear function.

DPOAE STC Measurements

The specific influence of suppression of one frequency on another frequency in our model (e.g., signal processing strategy as described herein with reference to FIGS. 1-14 and 17-20) is based on measurements of DPOAE suppression tuning curves (STCs) of Gorga et al. (2011a, b). Therefore, we will first describe these DPOAE measurements, which the model is based on, before we describe the signal processing strategy later herein.

In DPOAE suppression experiments, DPOAEs were elicited in normal hearing subjects (e.g., human subjects) by a pair of primary tones $f_1$ and $f_2$ ($f_2/f_1 \approx 1.2$), whose levels were held constant while a third, suppressor tone $f_3$ was presented (Gorga et al. 2011a, b). The suppressive effect of $f_3$ was defined as the amount by which its presence reduces the DPOAE level in response to the primary-tone pair. By varying both the frequency and the level of $f_3$, information about the influence of the frequency relation between suppressor tone and primary tone (primarily or mainly $f_2$) on the amount of suppression was obtained. The DPOAE measurements that are used in the design of a model (e.g., described herein) for human cochlear suppression include eight $f_2$ frequencies (0.5, 1, 1.4, 2, 2.8, 4, 5.6 and 8 kHz) and primary tone levels $L_2$ of 10 to 60 dB SL in 10 dB steps. For each $f_2$ frequency, up to eleven $f_3$ frequencies around or surrounding $f_2$ were used. There are many studies of DPOAE STCs, all of which are in general agreement and which could be used herein. However, Gorga et al. provided data for the widest range of frequencies and levels in a large sample of humans with normal hearing. Thus, such data are used as the basis for the signal-processing strategy described herein.

In DPOAE measurements, the DPOAE level is reduced when a third (suppressor) tone is present, and this reduction is often referred to as a decrement. Let d represent the decrement in DPOAE level due to a suppressor (i.e. 1 equals the DPOAE level without suppressor minus the DPOAE level with a suppressor). Gorga et al. (2011a) defined a transformed decrement D as $$D=10 \log_{10}(10^{d/10}-1). \qquad (1)$$

A simple linear regression (SLR) fit to the transformed decrement D provides slopes of the suppression-growth functions. The transformed decrement has been shown to have approximately linear dependence on both the primary level $L_2$ and suppressor level $L_3$:

$$D=a_1+a_2 L_2+a_3 L_3. \qquad (2)$$

The regression coefficients ($a_1$, $a_2$, $a_3$) in this equation all depend on both the primary frequency $f_2$ and the suppressor frequency $f_3$. Suppression tuning curves, such as those shown in FIG. 1, which represent the level of the suppressor $L_3$ at the suppression threshold (i.e. D=0) are obtained by solving for $L_3$ in Eq. (2) when D=0 (Gorga et al. 2011b):

$$L_3|_{D=0} = -\frac{a_1}{a_3} - \frac{a_2}{a_3}L_2. \quad (3)$$

Note that when $f_3 \approx f_2$, the first term on the right side of this equation (plotted as isolated symbols in FIG. 1) approximately equals the quiet threshold for a tone at $f_3 \approx f_2$. For visual clarity, FIG. 1 shows DPOAE STCs for only a subset of the 8 frequencies for which data are available, including, $f_2$=1, 2, 4 and 8 kHz. Refer to (Gorga et al. 2011b) for the complete set of STCs.

Figure 2:
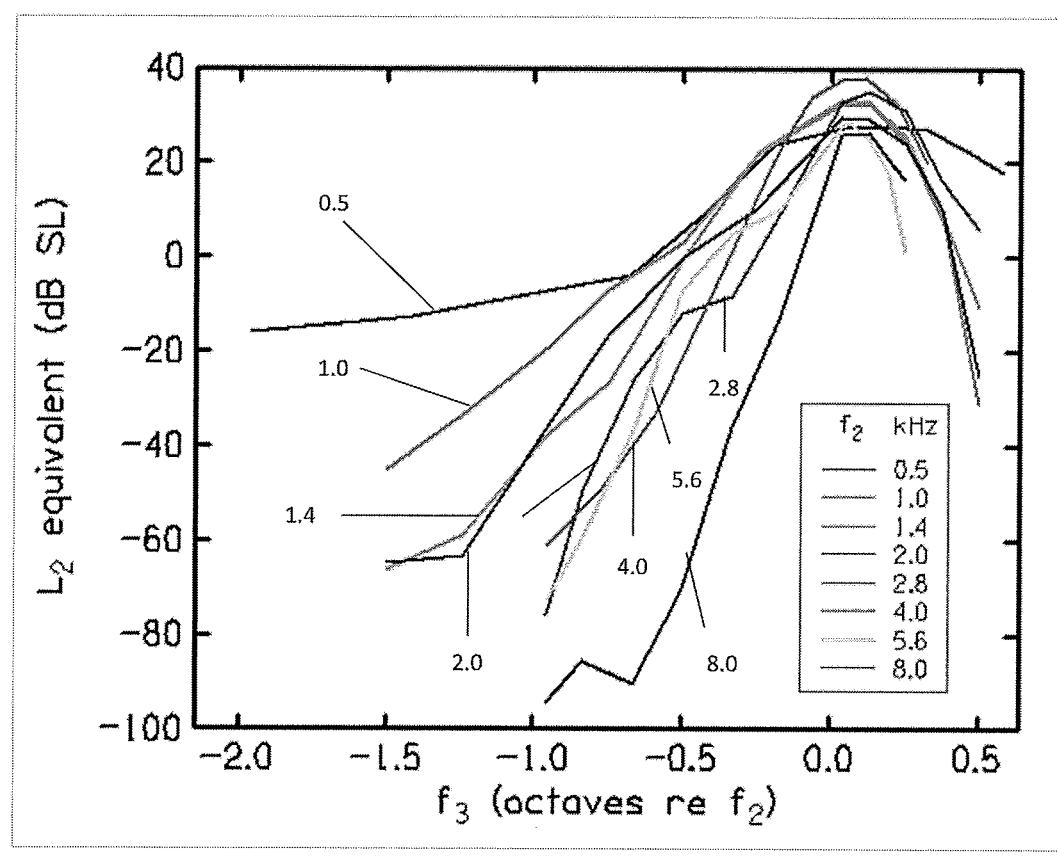
FIG. 2 shows equivalent primary levels (dB SL) when suppressor level is 40 dB SPL and $f_2$ is as stated in the figure inset. Note that $L_2$ appears to have nearly linear dependence on $f_3$ below $f_3 \approx f_2$. This trend may be used to generalize the dependence of $L_2$ on $f_2$ and $f_3$ in an extrapolation procedure described herein.

The suppression due to a single tone of the growth of its own cochlear response is what causes its response growth to appear compressive. The relative contribution of a suppressor tone at $f_3$ to the total compression of a tone at $f_2$ may be obtained by solving Eq. (3) for $L_2$ when D=0:

$$L_2|_{D=0} = c_1 + c_2 L_3, \quad (4)$$

where $c_1 = -a_1/a_2$ and $c_2 = -a_3/a_2$. $L_2$ as a function of $f_3$ (in octaves relative to $f_2$) at $L_3$=40 dB SPL is shown in FIG. 2.

Figure 3:
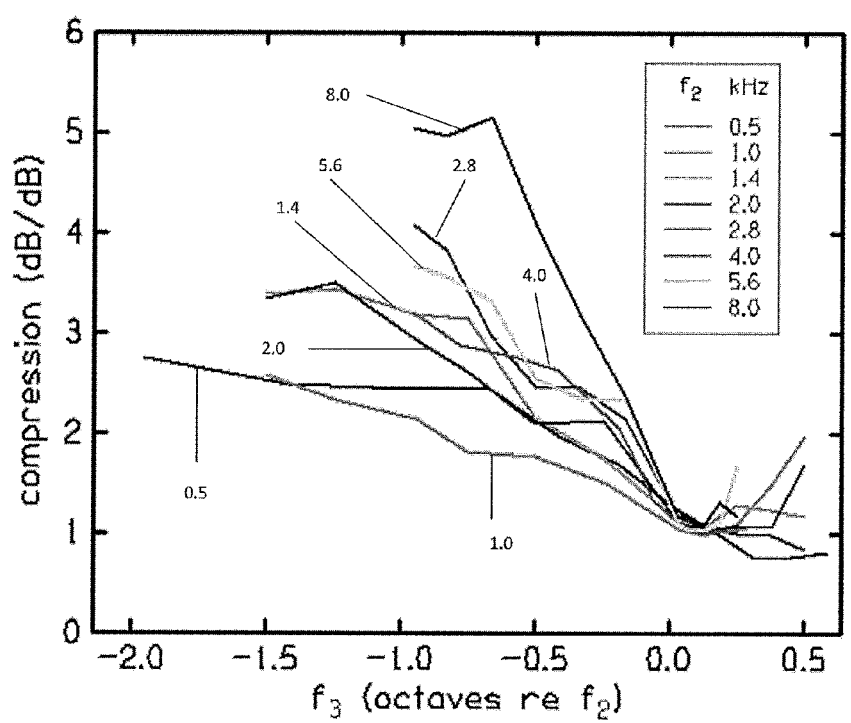
FIG. 3 shows a ratio of regression coefficients ($c_2=-a_3/a_2$) from Gorga et al. (2011). $c_2$ represents compression (dB/dB) as a function of $f_3$ in octaves relative to $f_2$. This trend may be used to generalize the dependence of $c_2$ on $f_2$ and $f_3$ in an extrapolation procedure described herein.

The coefficient $c_2$ describes the compression of $f_2$ (relative to compression at $f_3$) and is plotted in FIG. 3. Note that $L_2$ and $c_2$ both appear to have nearly linear dependence on frequency $f_3$ (when expressed in octaves relative to $f_2$) below $f_3 \approx f_2$ and that $c_2 \approx 1$ when $f_3 \approx f_2$. We use these trends to generalize the dependences of $L_2$ and $c_2$ on $f_2$ and $f_3$, and obtain extrapolated $c_2$ and $c_1$ (obtained from extrapolated $L_2$ and $c_2$ using Eq. (4)) that we use in the model or signal processing strategy to determine frequency-dependent gains. Extrapolation of $c_2$ and $c_1$ allows the model simulations to be done or the signal processing strategy to be applied at any frequency of interest, and not just at the frequencies that were used in the DPOAE STC measurements.

The extrapolation may be a two-step polynomial-regression procedure that allows for the extension of the representation of $c_2$ and $c_1$ from the available (data) frequencies to the desired (model) frequencies. First, separate polynomial regressions may be performed to describe the $f_3$ dependence (of the data shown in FIGS. 2 and 3) for both of the coefficients $c_2$ and $L_2$ at each of the eight $f_2$ frequencies. A second set of polynomial regressions may be performed to describe the $f_2$ dependence of the coefficients of the 16 initial polynomials (8 for $c_2$ and 8 for $L_2$). The result of this two-step regression may be a set of two polynomials that allow for calculation of values for $c_1$ and $c_2$ for any desired pair of frequencies $f_2$ and $f_3$. Additional constraints may be imposed to adjust the calculated values when they do not represent the data. In one implementation, the two-step regression procedure reduces the representation of $c_2$ from 88 (8 $f_2$×11 $f_3$ frequencies) data points down to 10 coefficients and the representation of $L_2$ from 88 data points down to 15 coefficients.

Suppression Model and/or Hearing-Aid Design

Figure 4:
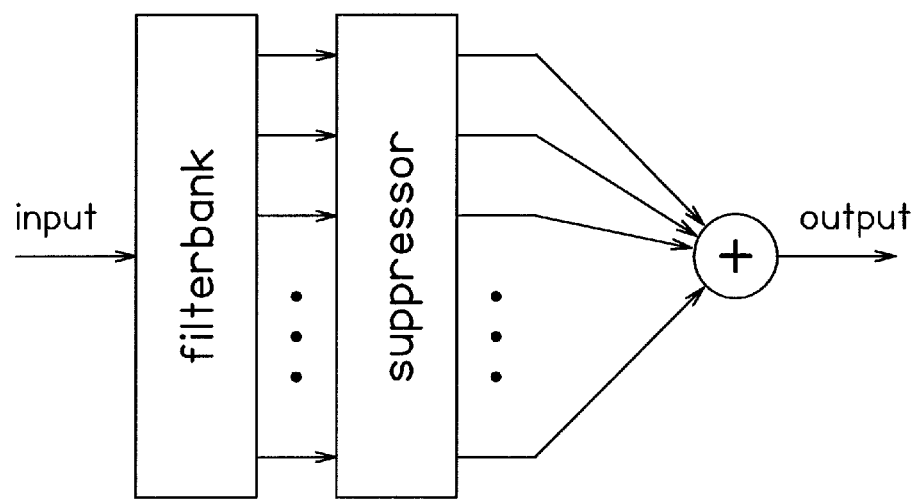
FIG. 4 shows a block diagram of a model for human cochlear suppression. The model includes three stages: (1) analysis using a gammatone filterbank, (2) suppressor stage where frequency-dependent channel gains are calculated, and (3) a synthesis stage that combines and produces an output signal with suppressive influences.

The signal-processing model or simulation of human cochlear suppression, block diagram shown in FIG. 4 (which may be implemented by processing circuitry in a hearing aid as described herein), includes three main stages; (1) analysis, (2) suppression, and (3) synthesis. In the analysis stage, the input signal is analyzed into frequency bands using a gammatone filterbank. The suppression stage determines gains that are to be applied to each frequency band in order to achieve both compressive and suppressive effects. In the last stage, the individual outputs of the suppression stage are combined to obtain an output signal with suppressive effects. These three stages may be incorporated into hearing aid devices using any suitable hardware/software configurations.

For example, any functionality described herein may be implemented in a computer-readable medium that includes instructions for causing a programmable processor to carry out the functions described herein (e.g., applying gain to each channel corresponding to a frequency band based on a suppressive level). A "computer-readable medium" includes but is not limited to any volatile or non-volatile media, such as a RAM, ROM, CD-ROM, NVRAM, EEPROM, flash memory, and the like. The instructions may be implemented as one or more software modules, which may be executed by themselves or in combination with other software.

The hardware used to implement the described functionality may include any suitable components (e.g., those used to currently implement functionality in hearing aid devices). For example, such components may include one or more of a microprocessor, a digital signal processor (DSP), a controller, an application specific integrated circuit (ASIC), a field programmable gate array (FPGA), or equivalent discrete or integrated logic circuitry. In one or more exemplary embodiments, the processor may include multiple components, such as any combination of one or more microprocessors, one or more controllers, one or more DSPs, one or more ASICs, or one or more FPGAs, as well as other discrete or integrated logic circuitry. The functions and processes described herein may be embodied as software, firmware, hardware, or any combination thereof.

Hearing aid devices which use the techniques described herein may include those which output either (1) an audio signal to the external ear canal or (2) vibration directly to the bones of the middle ear. Another category of hearing aid devices that may benefit from the multiband audio compression described herein is commonly referred to as implantable auditory prostheses (IAP). These devices may differ from hearing aids in outputting an electrical signal that directly stimulates auditory neurons. For example, a common example is a cochlear implant. The audio input to an IAP is substantially identical to a hearing aid, and as such the need for multiband compression is similar in this hearing aid device as well. One signal-processing difference may be that IAPs typically have multi-channel outputs, whereas hearing-aids typically have a single output.

A. Model or Strategy Analysis

Frequency analysis may be performed using a complex gammatone filterbank with 31 channels that span the frequency range up to 12 kHz (e.g., see Patterson and Holdsworth 1996, Hohmann 2002). The filterbank design of Hohmann, which requires a complex filterbank, may be utilized because of its flexibility in the specification of frequency spacing and bandwidth, while achieving optimally flat group delay across frequency. In the example described herein, the individual gammatone filters of the filterbank were of order n=4 and were implemented using the infinite impulse response algorithm of Härmä (1999). The filterbank was designed such that filters above 1 kHz had the same tuning of $Q_{ERB}$=8.65 and center frequencies $f_c$ that are logarithmically spaced with ⅙-octave steps, where $Q_{ERB}$ is defined as $f_c/ERB(f_c)$ and $ERB(f_c)$ is the equivalent rectangular bandwidth of the filter with center frequency $f_c$ (see Shera et al. 2010). In a filterbank design with logarithmically-spaced filters, broader filters which are used for high frequencies give lower processing delay and narrower filters which are used for low frequencies give higher processing delay. To keep the delay at low frequencies within acceptable limit, the filters below 1 kHz were designed to have a constant ERB of 0.1 kHz and linearly spaced center frequencies with 0.1 kHz steps. The filter at 1 kHz had an ERB of 0.11 kHz to create a smooth transition in the transfer function. The individual gammatone filters of the filterbank may be fourth-order infinite impulse response (IIR) filters. Filter coefficients may be calculated using the gammatone algorithm of Härmä (see A. Härmä, Derivation of the complex-valued gammatone filters. (Online at www.acoustics.hut.fi/software/HUTear/Gammatone/Complex_gt.html).

The outputs of the gammatone filterbank are complex-valued bandpass-filtered time-domain components of the input signal where the real part represents the band-limited gammatone filter output and the imaginary part approximates its Hilbert transform (see Hohmann (2002)). The use of complex-valued gammatone filters facilitates accurate calculation of the instantaneous time-domain level since two signals, the imaginary and real parts, are involved in the computation of the level as opposed to use of only one signal when the filter outputs are real. Thus, complex gammatone filters produce an analytic representation of the signal, which facilitates accurate calculation of the instantaneous time-domain level.

The individual outputs of the gammatone filterbank can experience different delays which can affect the estimation of the latencies of these outputs. Compensation for delay of the gammatone filters may be performed in the filterbank stage by delaying the fine structure and the envelope of each filter's impulse response so that all channels have their envelope maximum and their fine-structure maximum at the same time instant, the desired filterbank group delay (see Hohmann (2002)). In other words, the individual outputs of the filterbank may produce different delays which may result in a synthesized output signal with a dispersive impulse response. Compensation for delay of the filters to avoid dispersion may be performed in the filterbank stage by adjusting both the fine-structure phase and the envelope delay of each filter's impulse response so that all channels have their envelope maximum and their fine-structure maximum at the same targeted time instant. In one application, this delay (e.g., target delay) was selected to be 4 ms. Although other filters may be used, the advantage of using the gammatone filterbank over other filterbanks (e.g. Fourier transform, continuous-wavelet transform, etc.) is that it allows frequency resolution to be specified as desired at both low and high frequencies. Additionally, gammatone filters are often used in psychophysical auditory models (e.g., see Patterson and Holdsworth (1996); Meddis et al. (2001); Jepsen et al. (2008)) because of their similarity to physiological measures of basilar membrane vibrations (e.g., see Rhode and Robles (1974)).

Figure 5:
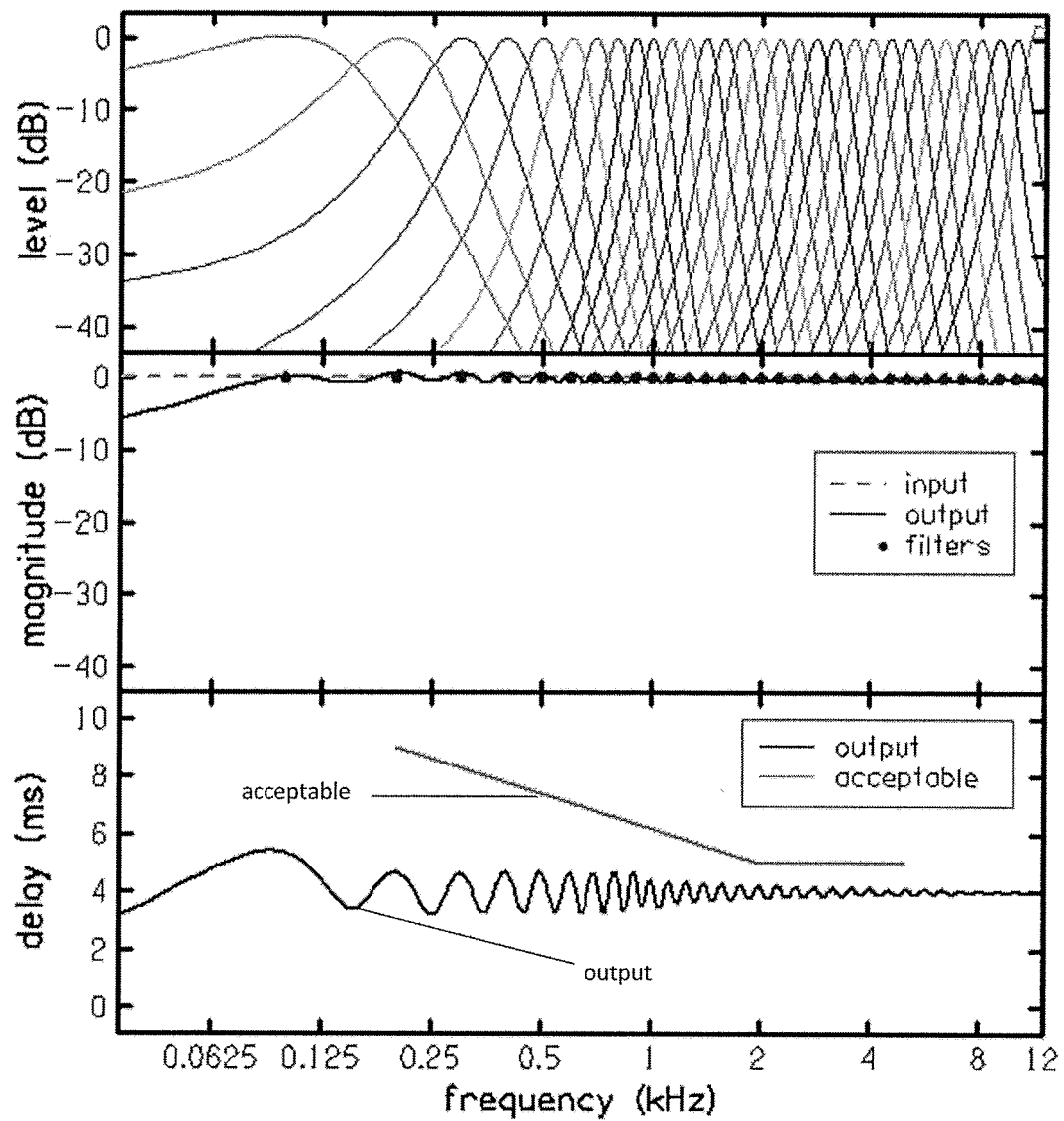
FIG. 5 shows frequency responses of individual gammatone filters (upper panel), and of the input and output signals (middle panel). Also shown in this panel is the rms level of the individual filters. The lower panel shows delay of the output signal and delay tolerable by hearing aid users.

FIG. 5 shows the frequency response of the individual gammatone filters (upper panel) and the frequency responses of the output signal and the root mean square (rms) levels of the individual filters (middle panel) when the input is an impulse. The frequency response of the output signal, which represents the impulse response, is flat from 0.1 kHz with small oscillations of less than 1.5 dB. The rms level of the individual filters matches the impulse response. The group delay of the impulse response (bottom panel) is nearly a constant 4 ms, as desired. The relatively minor oscillation around this constant delay is largest at low frequencies. This delay is lower than the maximum delay tolerable by hearing aids users (see Stone et al. (2008), Moore et al. (2003)).

B. Suppression

The suppression stage of the model determines gains that are to be applied to each frequency band in order to achieve suppressive effects. The gain applied to a particular frequency band is time-varying and is based on the instantaneous level of every filterbank output in a manner based on measurements of DPOAE STCs. However, unlike in DPOAE suppression measurements where the suppressive effect of a suppressor frequency ($f_3$) on the DPOAE level in response to two primary tones ($f_2$ and $f_3$) was represented, the model represents the influence of a suppressor frequency ($f_s$) which is equivalent to $f_3$ on a probe frequency ($f_p$) which is equivalent to $f_2$. Henceforth, we will use $f_s$ and $f_p$ in the description of the model.

Suppose that the total suppressive influence on a tone at f of multiple suppressor tones at $f_j$ can be described by summing the individual suppressive intensities of each tone:

$$L_s(f) = 10 \cdot \log_{10}\left(\sum_{j=1}^{N} 10^{S_j(f)/10}\right), \tag{5}$$

where $$S_j(f) = c_1(f, f_j) + c_2(f, f_j) \cdot L_j, \tag{6}$$

represents the individual suppressive level on a tone at f of a single suppressor tone at $f_j$, and $L_j$ is the filter output level at $f_j$. The total suppressive influence combines the suppressive effect of all frequency components into a single, equivalent level $L_s$ that would cause the same reduction in gain (due to compression) if it was the level of a single tone. Coefficients $c_1$ and $c_2$ may be derived from the DPOAE data [see Eq. (4)] as described herein. The sum in Eq. (5) is over all frequency components, including the suppressed tone. The form of Eq. (5) allows a typical decrement function to be reconstructed by subtracting the "control condition," which is the suppressive level for a one-component stimulus ($L_{S_1}$), from the "suppressed condition," which is the suppressive level for a two-component stimulus ($L_{S_2}$):

$$\begin{aligned}\text{decrement} &= L_{S_2} - L_{S_1} \\ &= 10\log_{10}\left(\frac{10^{S_1/10} + 10^{S_2/10}}{10^{S_1/10}}\right) \\ &= 10\log_{10}[1 + 10^{(S_2-S_1)/10}],\end{aligned} \tag{7}$$

Note that Eq. (7) has the form of a typical decrement function when $L_{S_1}$ is fixed and $L_{S_2}$ is varied. The form of Eq. (5) allows the concept of decrement to be generalized to any number of components in the control condition and any number of additional components in the suppressed condition.

Equation (5) describes the suppressive influence of the combination of all suppressor tones. This suppressive level is at least one benefit in the design of the model or strategy described herein. This design may use the specification of $c_1$ and $c_2$ for all possible pairs of frequencies in the set of filterbank center frequencies. A reference condition with compression, but no cross-channel suppressive influences, can be achieved by setting $L_s(f_j)=L_j$. This "compression mode" of operation may be useful for evaluating the effects of suppression in described signal-processing strategy. When $L_s(f_j)=L_j$, according to Eq. (8), the gain $G_s$ to be applied at frequency component $f_j$ is only a function of the level $L_j$ of that component. Equations (5) and (6), which bring up the cross-channel suppression, are not involved in the calculation of gain in this case.

Calculation of the frequency-dependent gain from $L_s(f)$ requires specification of four parameters, $L_{cs}(f)$, $L_{ce}(f)$, $G_{cs}(f)$ and $G_{ce}(f)$ where $L_{cs}$ and $L_{ce}$ (such that $L_{cs}<L_{ce}$) are filter output levels, and $G_{cs}$ and $G_{ce}$ (such that $G_{cs}>G_{ce}$) are filter gains associated with levels $L_{cs}$ and $L_{ce}$. The subscripts cs and ce, respectively stand for "compression start" and "compression end", indicating that $L_{cs}$ is the level where compressive gain is first applied and $L_{ce}$ is the level at which application of compressive gain ends with corresponding gains $G_{cs}$ and $G_{ce}$. When the filter output level is below $L_{cs}$, the filter gain is set to $G_{cs}$ and the gain is linear (i.e., there is no compression). Above $L_{ce}$, the filter gain equals $G_{ce}$, and again this gain is linear. That is, linear gain is used below $L_{cs}$ and above $L_{ce}$. When the filter output level is between $L_{cs}$ and $L_{ce}$, filter gain is compressive and decreases as a linear function of the suppressive level. So, the suppressive gain $G_s$ of each filter is a function of suppressive level and has three parts:

$$G_s(L_s) = \begin{cases} G_{cs} & L_s \leq L_{cs} \\ G_{cs} + (G_{ce} - G_{cs})\dfrac{L_s - L_{cs}}{L_{ce} - L_{cs}} & L_{cs} < L_s < L_{ce} \\ G_{ce} & L_s \geq L_{ce} \end{cases} \quad (8)$$

Figure 17:
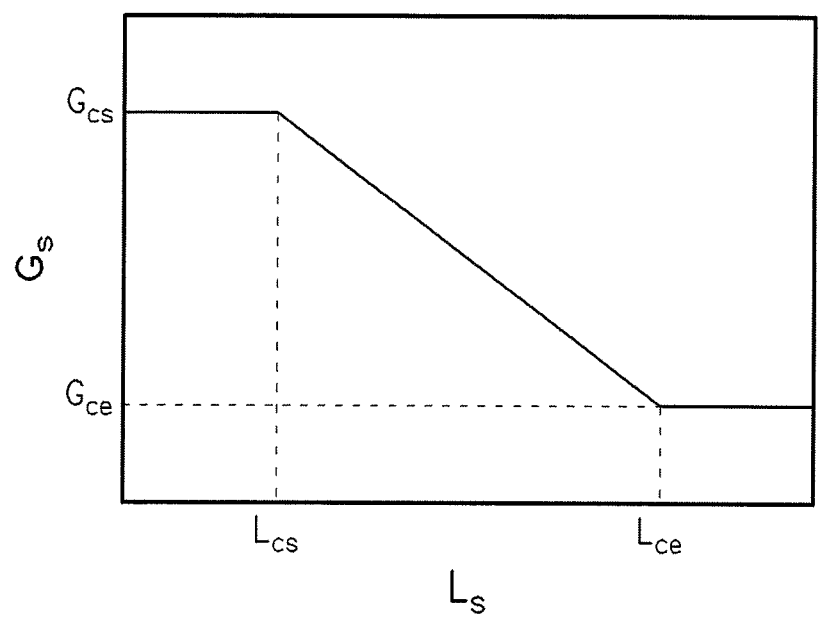
FIG. 17 shows an illustration of suppressive gain $G_s$ ($L_s$) described by Eq. (8) herein. $G_s$ and $L_s$ are both functions of frequency. $G_s=G_{cs}$ when $L_s \leq L_{cs}$ and $G_s=G_{ce}$ when $L_s \geq L_{ce}$, that is, the gain $G_s$ is linear and non-compressive. For $L_{cs}<L_s<L_{ce}$, the gain $G_s$ is compressive and depends on the suppressive level $L_s$.

The dependence of suppressive gain $G_s$ on suppressive level $L_s$ is illustrated in FIG. 17. The two pairs of parameters $(L_{cs}, G_{cs})$ and $(L_{ce}, G_{ce})$ determine the upper and lower knee-points of an input-output function that characterizes the compressive signal processing of the hearing aid. The compression ratio CR in a particular channel when the suppressive level is between $L_{cs}$ and $L_{ce}$ is $$CR = 1 + \frac{G_{ce} - G_{cs}}{L_{ce} - L_{cs}}. \quad (9)$$

An additional constraint may be imposed on $G_s$ in the form of a maximum gain $G_{max}$ defined such that the output level is never greater than a maximum output level $L_{max}$ in any specific channel. This may avoid loudness discomfort. In a wearable hearing aid, it may also be desirable to reduce $G_s$ at low levels (where $G_s$ is greatest) in order to gain eliminate acoustic feedback. In other words, a maximum gain $G_{max}$ may be defined such that the output level is not allowed to be greater than a maximum output level $L_{max}$. A control condition with compression, but no cross-channel suppressive influences, can be achieved by setting $L_s(f)=L_j$.

C. Synthesis

In the synthesis stage, the individual outputs of the suppression stage are combined to obtain an output signal with suppressive effects. The combination of the individual frequency bands is such that perfect reconstruction may be attained, that is, when the suppression stage is turned off, the output signal is approximately identical to the input signal, but with a delay that is equal to the filterbank compensation or target delay (e.g., 4 ms).

Evaluation of the Model or Strategy

Four tests described below assess the performance of a MATLAB (The MathWorks, Inc., Natick Mass.) implementation of the suppression hearing-aid (SHA) signal processing, especially with regard to its ability to reproduce two-tone suppression. For all four tests, the suppressive-gain parameters were set to the following values: $L_{cs}=0$, $L_{ce}=100$, $L_{max}=115$ dB SPL, $G_{cs}=60$ and $G_{ce}=0$ dB. In the simulations to follow, these settings were selected for application of SHA processing to a simulated flat hearing loss of 60 dB.

A. Nonlinear Input/Output Function

To create an input/output (I/O) function at a specific frequency, a single pure tone at a frequency of 4 kHz was input to the SHA simulation or model, its level varied from −20 to 120 dB SPL, and the level of the 4-kHz component of the output was tracked. I/O functions were created for the SHA simulation or model operation in normal suppression mode and in channel-specific compression mode (i.e., with no cross-channel suppressive influences).

Figure 6:
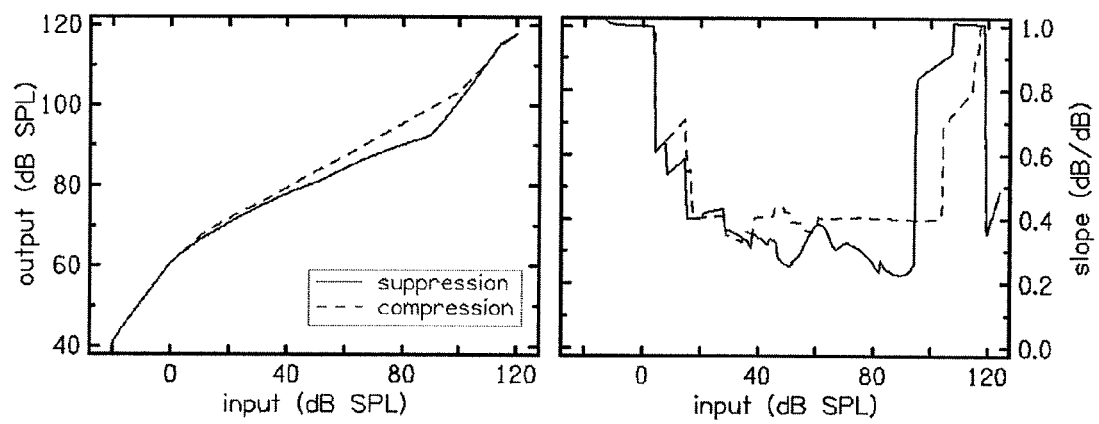
FIG. 6 shows input/output functions (left panel) and slopes (right panel) for model operation in suppression and compression modes.

The left panel of FIG. 6 shows the I/O functions for the two modes of model or simulation operation. $L_{cs}=0$ dB SPL and $L_{ce}=100$ dB SPL define two knee-points in the I/O function that represent input level where compression starts and end, respectively. The two I/O function both have a slope of unity when the input level is less than $L_{cs}=0$ dB SPL indicating that $G_s=0$ dB [cf. Eq. (8)] and that the output level is equal to the input level. Both I/O functions also have unity slope above $L_{ce}=100$ dB SPL, except that the knee-point for the model operation or simulation in suppression mode occurs 10 dB below $L_{ce}=100$ dB SPL due to across channel spread in the energy of the 4 kHz tone introduced by Eq. (5). When the input level is between $L_{cs}$ and $L_{ce}$, the slopes of the two I/O functions are both less than unity, with the compression mode having a steeper slope.

The right panel of FIG. 6 shows estimates of the slopes of the two I/O functions as function of the input level. This figure shows that the slope of the I/O function is not a good estimator of the compression ratio, despite the fact that it is often used for this purpose (e.g., see Dorn et al. (2001s)). The slope of the I/O function is not constant between the two knee-points, but instead varies by as much as 0.18 dB/dB for the suppression mode. This corresponds to change in the compression ratio estimate of 3.0 dB/dB.

B. Two-Tone Suppression

To simulate two-tone suppression, a tone pair was input to the SHA simulation or model. The first tone, called the probe tone, was fixed in frequency and level to $f_p=4$ kHz and $L_p=40$ dB SPL. The frequency of the second tone, called the suppressor tone, was set to $f_s=4.1$ kHz to simulate 'on-frequency' suppression, and to $f_s=2.1$ kHz to simulate 'off-frequency' suppression. When simulating on-frequency suppression, $f_s$ is set to a frequency that is slightly different from (e.g., higher than) $f_p$ because if $f_s$ was set equal to $f_p$ then $f_s$ would add to $f_p$ instead of suppressing $f_p$. In both on-frequency and off-frequency suppression, the level of the suppressor tone $L_s$ was varied from 0 to 100 dB SPL, while tracking the output level at the probe frequency. To obtain an estimate of the amount of suppression produced by the suppressor, the decrement, the output level was subtracted from the output level obtained in the absence of a suppressor tone. Results were generated for model operation (or simulation) in normal suppression mode and in compression mode.

Figure 7:
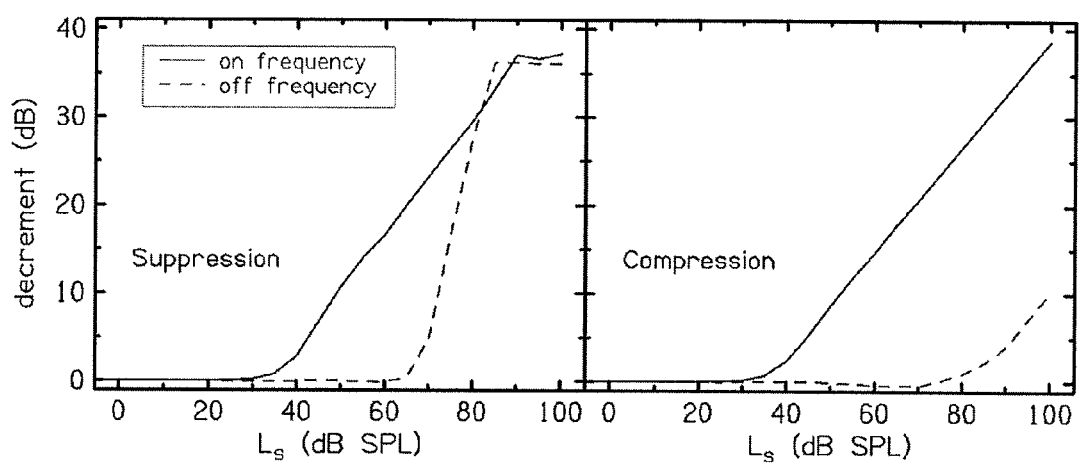
FIG. 7 shows decrements for on-frequency and off-frequency suppressor tones when the model is operating in suppression mode (left panel) and compression mode (right panel).

The left panel of FIG. 7 shows decrements for on-frequency and off-frequency suppressors obtained with the suppression mode of model operation. The level of the suppressor needed for onset of suppression is lower in the on-frequency case ($L_s \approx 35$ dB SPL) compared to the off-frequency case ($L_s \approx 65$ dB SPL). However, once onset of suppression has been reached, suppression grows at a faster rate in the off-frequency case compared to the on-frequency case. These findings are consistent with other studies of OAE suppression (e.g., see Gorga et al. (2011a), Zettner and Folsom (2003)).

The right panel of FIG. 7 shows decrements for on-frequency and off-frequency suppressors obtained with the compression mode of model operation. Again, onset of suppression requires a lower suppressor level for the on-frequency case compared to the off-frequency case. However, the level of the suppressor required for onset of suppression in the off-frequency case in much higher and suppression grows at the same rate in both cases. The reason why there is little suppression in the off-frequency case may be the lack of cross-channel influences in the calculation of the gain.

C. Tip and Tail Suppression Thresholds

To determine suppression thresholds, decrements were created following procedures described earlier for the same probe frequency $f_p=4$ kHz and suppressor frequencies $f_s=2.1$ and 4.1 kHz. $f_s=2.1$ and 4.1 kHz represent the tip and tail of a tuning curve with $f_p=4$ kHz, respectively. The decrements d were created for probe level of $L_p=30$ to 85 dB. Each decrement was transformed using Eq. (1) and then the transformed decrement was fit with a simple linear regression. The transformed decrement was solved to determine the suppressor level $L_s$ that results in D=0 dB (equivalent to d=3 dB), which was defined as the suppression threshold (see Gorga et al. (2011a)). Suppression thresholds were determined only for model operation in suppression mode.

Figure 8:
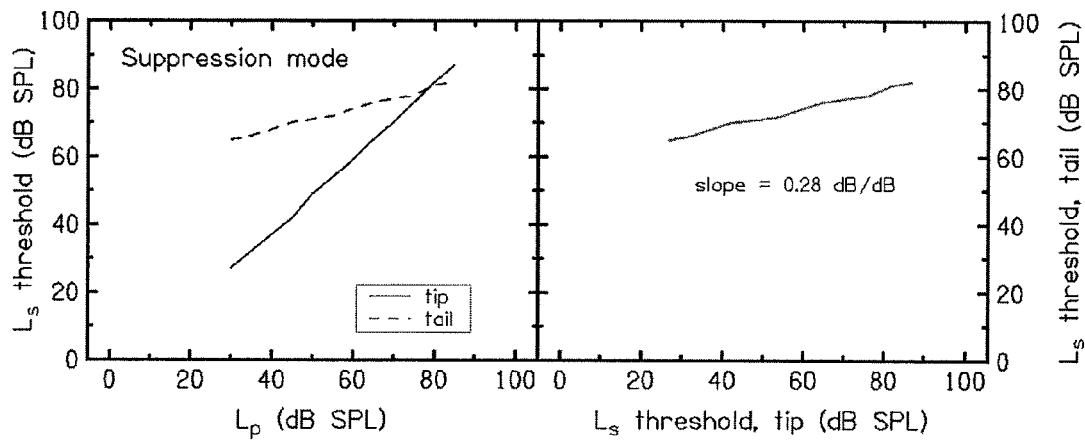
FIG. 8 shows tip and tail suppression threshold for a 4 kHz probe tone for model operation in suppression mode plotted separately (left panel) and relative to each other (right panel). The slope of the relative suppression threshold, 0.28, provides an estimate of the inherent compression ratio.

The left panel of FIG. 8 shows tip and tail suppression thresholds. A higher suppressor level $L_s$ is required to attain suppression threshold at the tail compared to at the tip, and this $L_s$ has a narrower range at the tip compared to at the tail. These findings are consistent with previous studies on tuning curves (e.g., see Gorga et al. (2011b), Zettner and Folsom (2003)). The slope of a plot of suppression threshold (ST) at the tip as a function of ST at the tail has been suggested as providing a good estimate of the inherent compression ratio (see Lopez-Poveda and Alves-Pinto (2008)). The lower panel of FIG. 8 shows such a plot. The slope of the function, determined by fitting a SLR to the function, is 0.28 dB/dB, which correspond to a tuning ratio of 3.6 dB/dB.

D. Suppression Tuning Curves

Suppression tuning curves (STCs) were simulated at four probe frequencies $f_p=1$, 2, 4 and 8 kHz, and six probe levels $L_p=10$ to 60 dB SL in 10 dB steps. For each probe frequency, fifteen suppressor frequencies from two octaves below to one octave above the probe frequency were evaluated. STC represent the level of the suppressor $L_s$ required for threshold of suppression as a function of suppressor frequency $f_s$. At each probe frequency and a particular suppressor frequency, the suppressor level was varied from $L_s=0$ to 100 dB SPL and the suppression threshold [D=0; Eq. (2)] was determined using methods described herein.

Figure 9:
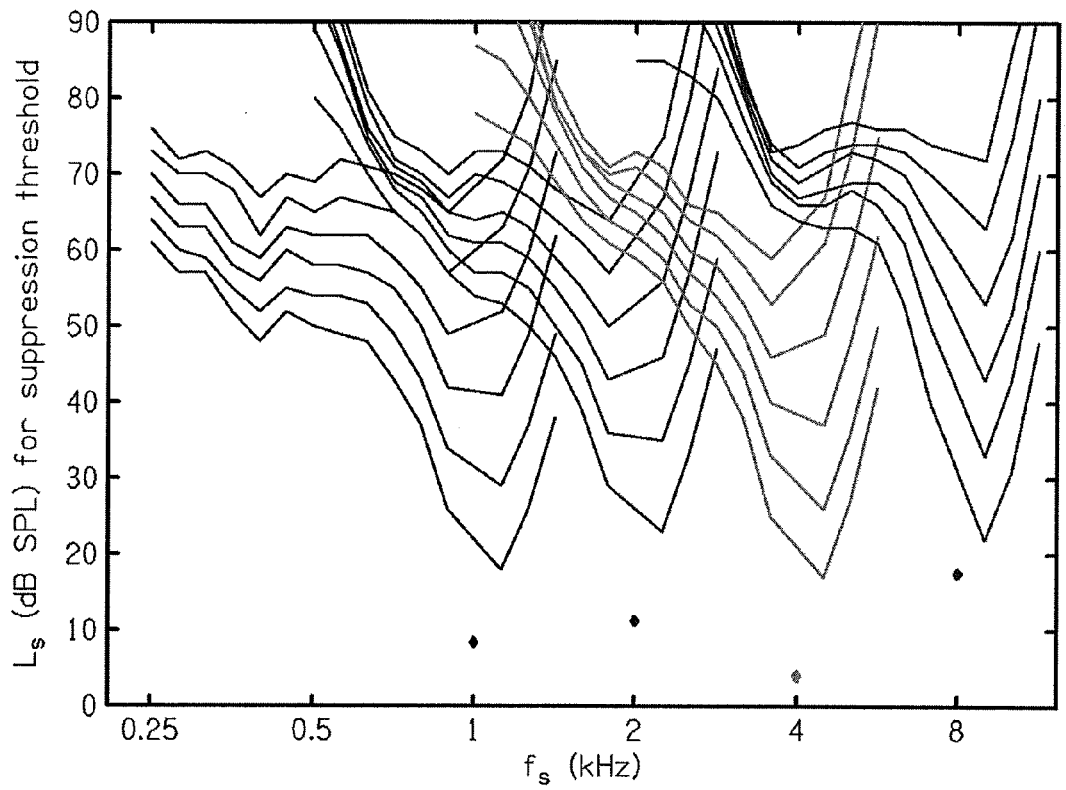
FIG. 9 shows suppression tuning curves (STCs) obtained using the model for human cochlear suppression. The STCs are qualitatively similar to measurements of DPOAE STCs.
Figure 10:
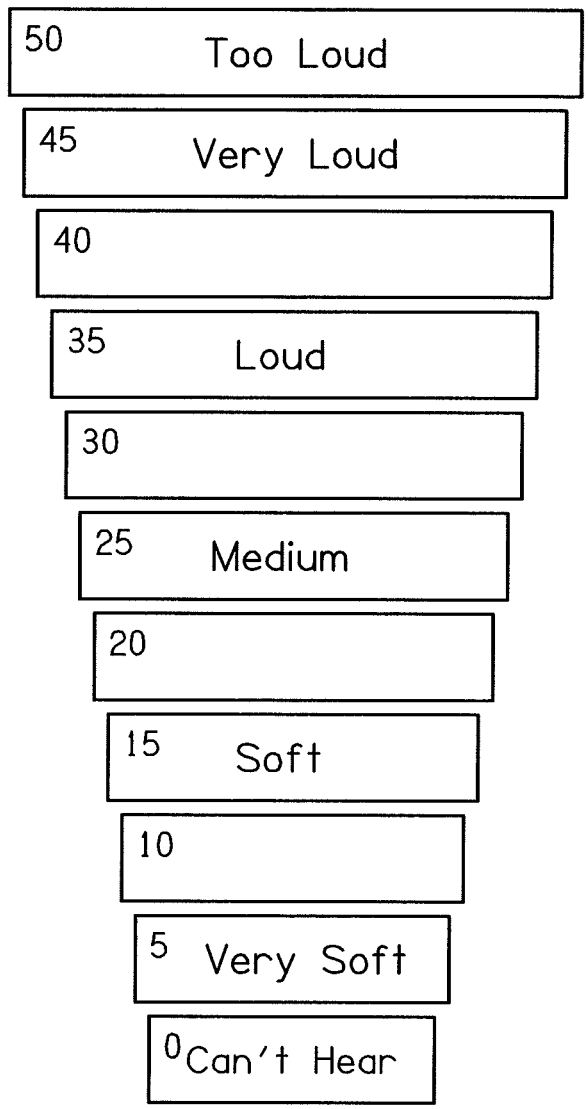
FIG. 10 shows a categorical loudness scale with eleven response categories from Al-Salim et al. (2010). Input levels for 'very soft' and 'very loud' categories may be used in the hearing-aid fitting strategy.

FIG. 9 show STCs obtained using the model. These STCs are qualitatively similar to measurements of DPOAE STCs of Gorga et al. (2011b). One difference is that $Q_{ERB}$ is relatively independent of frequency for the model STCs, whereas $Q_{ERB}$ increases with frequency for the DPOAEs STCs. This difference may be a consequence of approximations made when fitting suppressor parameters to the DPOAE data; as a consequence, this difference could be reduced by further refinement of these methods. The model STCs are similar to the DPOAE STCs in their absolute level and their dependence on probe-tone level.

E. Spectral Contrasts

Figure 18:
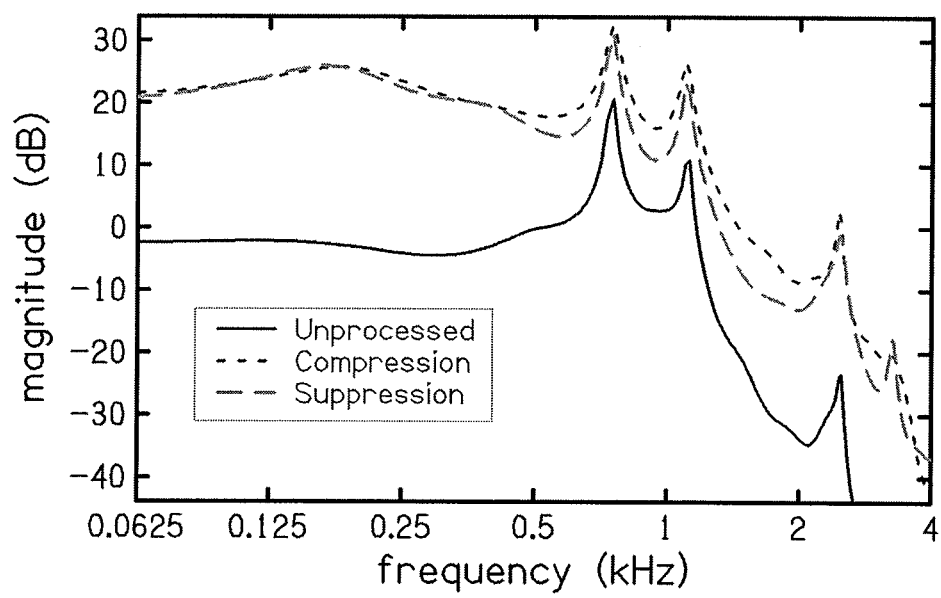
FIG. 18 shows an illustration of the spectrum of synthetic vowel /α/ spoken by a male after processing using compression mode (dotted line) and suppression mode (dashed line). Solid line is the unprocessed vowel. The input level is 70 dB SPL. Suppression may improve spectral contrast by increasing the difference in level between peaks and troughs.

Enhancement of spectral contrasts may improve speech perception in the presence of background noise (Turicchia et al. (2005); Oxenham et al. (2007)). To illustrate the effect of the processing described herein on spectral contrast, FIG. 18 shows the outputs obtained in compression and suppression modes when processing the synthetic vowel /ɑ/ spoken by a male. The pitch of the vowel ($F_0$) is 124 Hz, and the first three formants are at $F_1=730$ Hz, $F_2=1090$ Hz, and $F_3=2410$ Hz (see, Peterson et al. (1952). The solid line is the original vowel (unprocessed input) at a level of 70 dB SPL, a conversational speech level. The dotted line is the output obtained in compression mode and the dashed line is the output obtained in suppression mode. Output vowels obtained with both modes of operation are at a higher SPL compared to the original vowel, as a result of the gain applied. The two outputs are similar in that they both have boosted the level of the third formant relative to the first and second formants. The level of $F_0$ is also more pronounced in the two outputs compared to the original vowel (peak near 124 Hz in the outputs). Comparing the two outputs, it is recognized that suppression improves spectral contrast (i.e., the peak-to-trough difference is larger).

A spectral-contrast measure was defined as the average of the three formant peaks minus the average of the two intermediate minima, in order to quantify the spectral contrasts of FIG. 18. Spectral-contrast magnitudes are 13.56, 13.84 and 15.30 dB for unprocessed, compression output and suppression output, respectively. Using the spectral-contrast measure, one can define spectral-contrast enhancement (SCE) as spectral contrast for processed minus spectral contrast for unprocessed vowel. Thus, SCE expresses spectral contrast of an output signal relative to that of the input signal. SCE>0 indicates that the processed signal has enhanced spectral contrast relative to the unprocessed signal. For the example presented here, SCE=0.28 dB for the output obtained in compression mode and SCE=1.74 dB for the output obtained in suppression mode. That is, the output obtained in suppression mode results in higher spectral-contrast enhancement compared to either the unprocessed vowel or the output obtained in compression mode. SCE measures for the synthetic vowel /ɑ/ and four other synthetic vowels /i/, /ɪ/, /ɛ/ and /u/ spoken by male and female speakers are presented in Table I in FIG. 19 for both the suppression and compression modes of SHA simulation when the input level was 70 dB SPL. The formant frequencies of the vowels ($F_0$, $F_1$, $F_2$ and $F_3$) are also included in Table I. At the input level of 70 dB SPL, a typical conversational level, processing in suppression mode results in positive SCE for all vowels, except vowel /i/ spoken by a female for which SCE=0 dB. The mean SCE across the 10 vowels and two genders is 1.78 dB. In contrast, processing in compression mode results in reduction of spectral contrast for most vowels, with a mean SCE of −1.15 dB. Although slightly different from what is used in typical nonlinear hearing-aid signal processing, the results with compression alone provide a first approximation of what might be expected with current processing strategies.

Figures 19, 20:
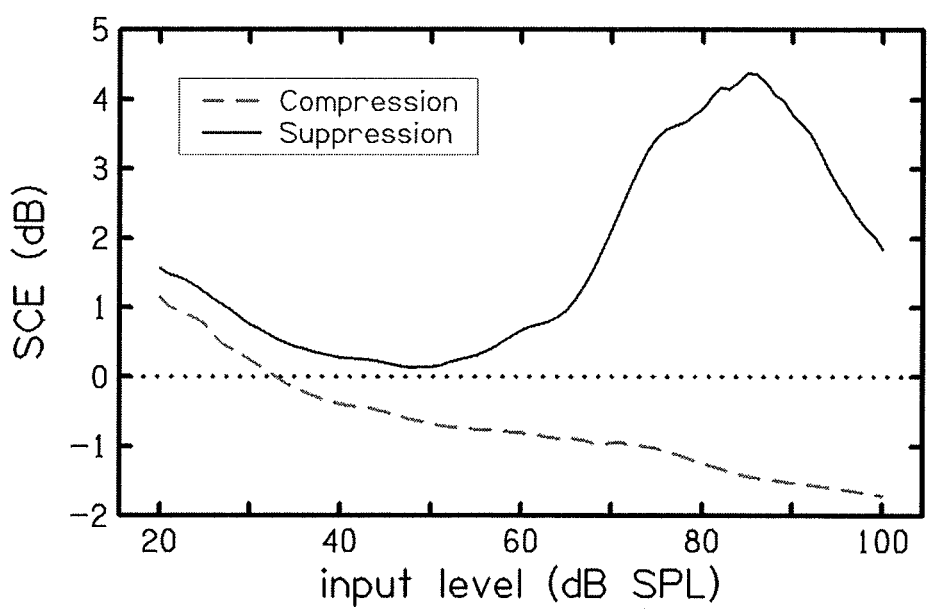
FIG. 19 shows a Table 1 for use in describing spectral contrast enhancement. Comp and Supp denote compression and suppression modes of model operation. The input level is 70 dB SPL.
FIG. 20 shows an illustration of mean spectral-contrast enhancement (SCE) across the ten synthetic vowels of Table 1 as a function of input level for output obtained in compression (dashed line) and suppression modes (solid line). Suppression results in spectral contrast enhancement for a wide range of levels.

To summarize the effect of input level on SCE, FIG. 20 shows mean SCE across the 10 synthetic vowels as a function of input level (20 to 100 dB SPL) for the two modes of SHA simulation. SCE for suppression mode (solid line) is greater than zero (indicated by dotted line) and higher than SCE for compression mode (dashed line) across all input levels. SCE for suppression mode reaches a maximum of 4.38 dB at an input level of 85 dB SPL. SCE for compression mode is only greater than zero at low levels (<33 dB SPL), indicating that the output obtained in this mode deteriorates spectral contrasts that were present in the original signal. The difference in SCE for suppression and compression modes may be as large as 5.81 dB (at an input 85 dB SPL). An alternate measure of SCE based on quality factor ($Q_{ERB}$) applied to the foil rant peaks was also evaluated. The results obtained with this alternate SCE measure were similar to those presented in Table I in FIG. 19 and in FIG. 20 so are not included here.

Hearing Aid Fitting Strategy

One hearing-aid fitting strategy is to provide frequency-dependent gain that is necessary to restore normal loudness to hearing impaired individuals. Specifically, the strategy aims to provide gain to a hearing impaired (HI) individual such that a sound (e.g., tone) that is perceived as 'very soft' by a normal hearing (NH) individual is also perceived as 'very soft' by a HI individual, and a sound that is perceived as 'very loud' by a NH individual is also perceived as 'very loud' by a HI individual. The idea is to maximize audibility for low level sounds while avoiding loudness discomfort at high levels. One would expect that this amount of gain will be too much for sounds other than pure tones; however, suppression will provide gain reduction in the hearing aid or other hearing device in the same way that suppression reduces gain in the normally functioning cochlea. Additionally, a maximum gain can be specified to avoid loudness discomfort at high levels, as described herein.

The signal-processing strategy described herein may only suppress the gain that it provides. It is assumed that the impaired ear will continue to suppress any residual outer hair cell (OHC) gain that it still possesses. In combination, suppression is divided between the external aid and the inner ear in the same proportion as their respective contributions to the total gain.

The hearing-aid fitting strategy requires categorical loudness scaling (CLS) data for the HI individual whom the hearing-aid is being fitted at several test frequencies and average CLS data for NH at the same frequencies (e.g., at 1 kHz). The CLS test described by Al-Salim et al. (2010) is exemplary. This test determines the input level of a pure tone at several test frequency that corresponds to each of the eleven categories shown in FIG. 10. Only seven of the eleven loudness categories have a text label but all have an associated categorical unit (CU) value. Meaningful adjectives (e.g., 'soft', 'medium', 'loud') are used as labels, consistent with the international standard for CLS (ISO 2006). Given the relationship between gain and CLS categories (described by Al-Salim et al. (2010)), exemplary 'very soft' (CU=5) and 'very loud' (CU=45) were used for the hearing-aid fitting strategy described herein.

The determination of the gain from CLS data may also be based on methods described by Al-Salim et al. (2010). In this method, average CLS data for NH is used to determine reference input levels for each loudness category that should be attained to restore normal loudness for HI through the application of gain. The gain required to elicit the same loudness percept in HI listeners as in NH listeners is then the difference between the normal reference input level and the input level required by HI listeners to achieve the same loudness percept.

The input levels for these categories will be represented as $L_{vs,NH}$ and $L_{vl,NH}$ for NH, and as $L_{vs,HI}$ and $L_{vl,HI}$ for HI. The input levels $L_{vs,NH}$ and $L_{vl,NH}$ at 1 kHz for the simulation are based on CLS data of Al-Salim et al. (2010). The values of $L_{vs,NH}$ and $L_{vl,NH}$ at other frequencies used in our hearing-aid simulator are taken as values of equal loudness contours (ISO-226, 2003) at phons that correspond to average SPL values of $L_{vs,NH}$ and $L_{vl,NH}$. This method of extrapolation is valid since an equal loudness contour by definition represents sound pressure in dB SPL as a function of frequency that a NH listener perceives as having constant loudness for pure tone stimuli. An example of the determination of $L_{vs,NH}$ and $L_{vl,NH}$ is shown in the left panel of FIG. 11 (dashed lines) using the average CLS data of Al-Salim et al. (2010). In this example, at 1 kHz, average values for 'very soft' and 'very loud' categories are $L_{vs,NH}$=22.9 and $L_{vl,NH}$=100.1 dB SPL, respectively. Thus, by definition, the corresponding loudness contours (two dashed lines) represent loudness levels of 22.9 and 100.1 phons. For comparison, the left panel of FIG. 11 also shows that the average levels (filled symbols) required for perception of tones as 'very soft' and 'very loud' at other frequencies (2 and 4 kHz) tested by Al-Salim et al. (2010) are in agreement with the equal loudness contours.

Figure 11:
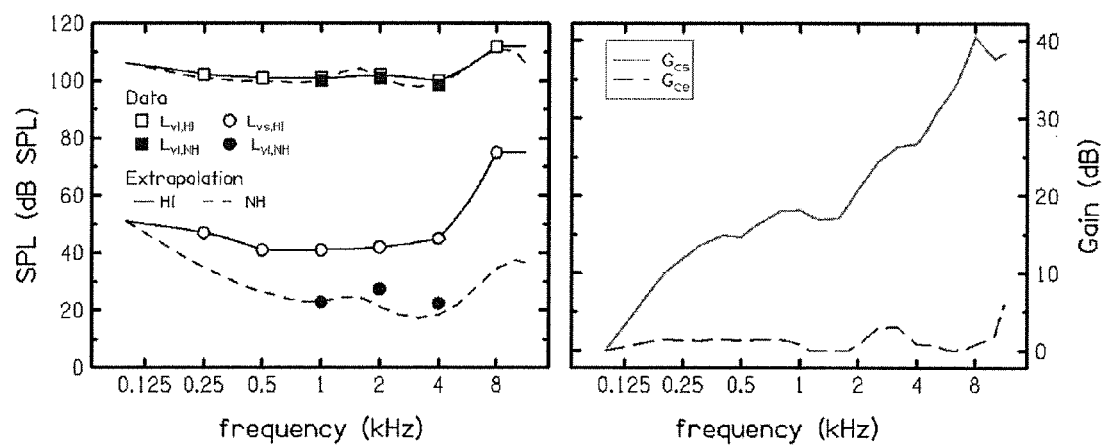
FIG. 11 shows input levels $L_{vs,NH}$, $L_{vl,NH}$, $L_{vs,HI}$, and $L_{vl,HI}$, and their extrapolations (left panel); Gains $G_{cs}$ and $G_{ce}$ determined from the input levels (right panel).

To further describe the fitting strategy, the left panel of FIG. 11 also shows input levels $L_{vs,HI}$ and $L_{vl,HI}$ for a hypothetical HI individual with CLS data at test frequencies of 0.25, 0.5, 1, 2, 4 and 8 kHz (open symbols). Values of $L_{vs,HI}$ and $L_{vl,HI}$ for the specific filterbank frequencies used in our SHA simulation may be obtained by interpolation and extrapolation. In this example, the input level required for the loudness category 'very soft' is higher for the HI individual compared to the NH individual, especially at high frequencies. However, the input levels required for the loudness category 'very loud' are close to the NH contours. The difference between $L_{vs,HI}$ and $L_{vs,NH}$ is the gain required for this hypothetical HI individual to restore normal loudness of 'very soft' sounds, and the difference between $L_{vl,HI}$ and $L_{vl,NH}$ is the gain required to restore normal loudness of 'very loud' sounds. In terms of the gain calculation of Eq. (8), these gains, and their associated input levels are:

$$G_{cs}=L_{vs,HI}-L_{vs,NH}$$

$$G_{ce}=L_{vl,HI}-L_{vl,NH}$$

$$L_{cs}=L_{vs,NH}$$

$$L_{ce}=L_{vl,NH}. \qquad (10)$$

The right panel of FIG. 11 shows gains $G_{cs}$ and $G_{ce}$ as function of frequency. The gain $G_{cs}$ is larger at high frequencies compared to low frequencies. The gain $G_{ce}$ is small (range of only 6 dB) and near constant with frequency since the levels $L_{vl,HI}$ and $L_{vl,NH}$ are similar. The particular frequency-dependence of gains $G_{cs}$ and $G_{ce}$ are each determined by the 'deficit' from the normal reference input levels of the particular HI individual.

Speech Processing

Typical performance of the suppression model is demonstrated by processing a speech sample. Values of parameters $L_{cs}$, $L_{ce}$, $G_{cs}$ and $G_{ce}$ used in this example were the same as those for the hypothetical HI subject described earlier [cf. FIG. 11]. $L_{max}$ was set to $L_{max}$=115 dB. The speech sample used was the sentence 'I saw you hit the cat,' spoken by a male speaker. Speech processing results were obtained for model operation in normal suppression mode and in compression mode, that is, with no cross-channel suppressive influences.

Figure 12:
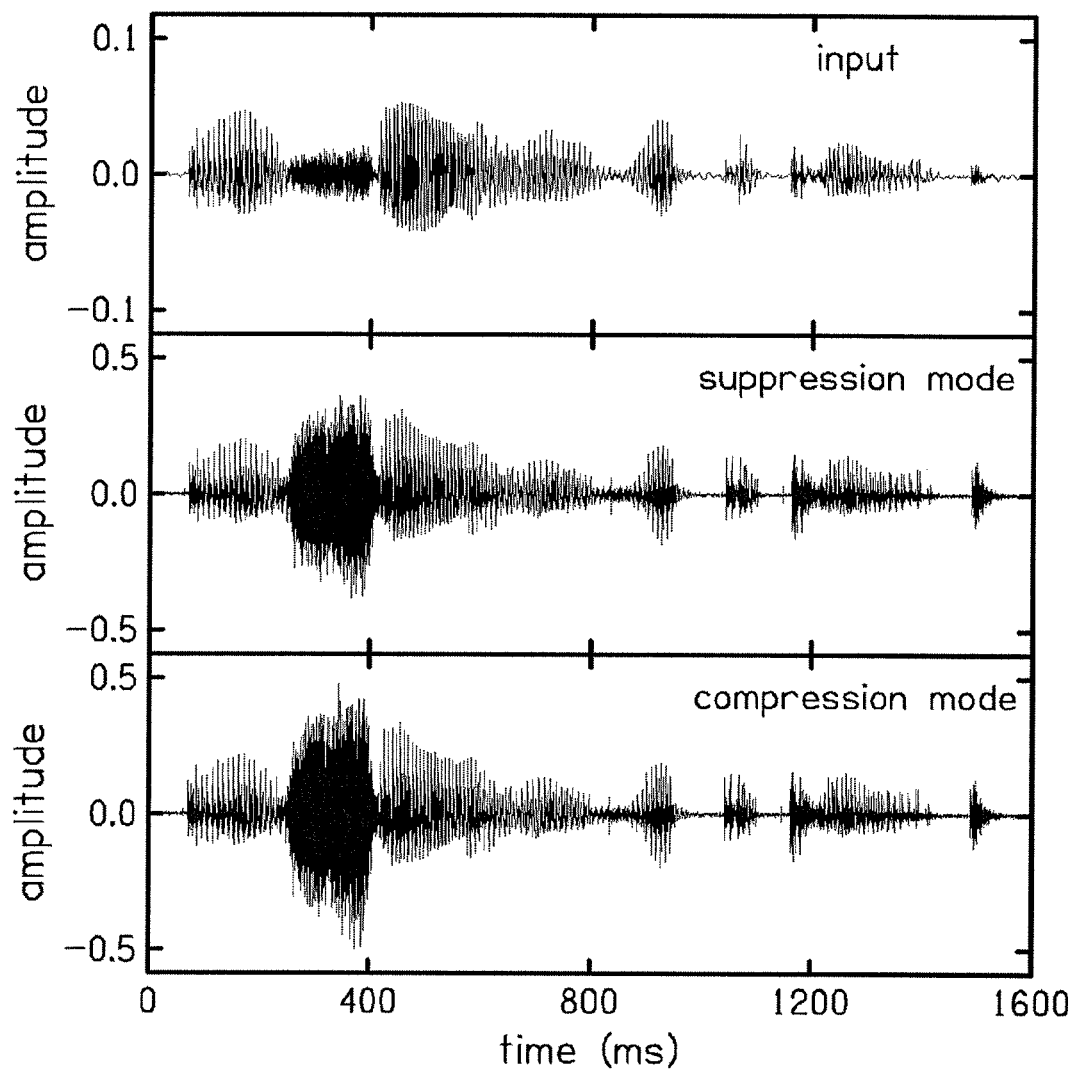
FIG. 12 shows input speech signal (top panel) and output speech signals obtained in suppression mode (middle panel) and in compression mode (bottom panel). Note that different ordinate scales are used for the input and the outputs for visual clarity.
Figure 13:
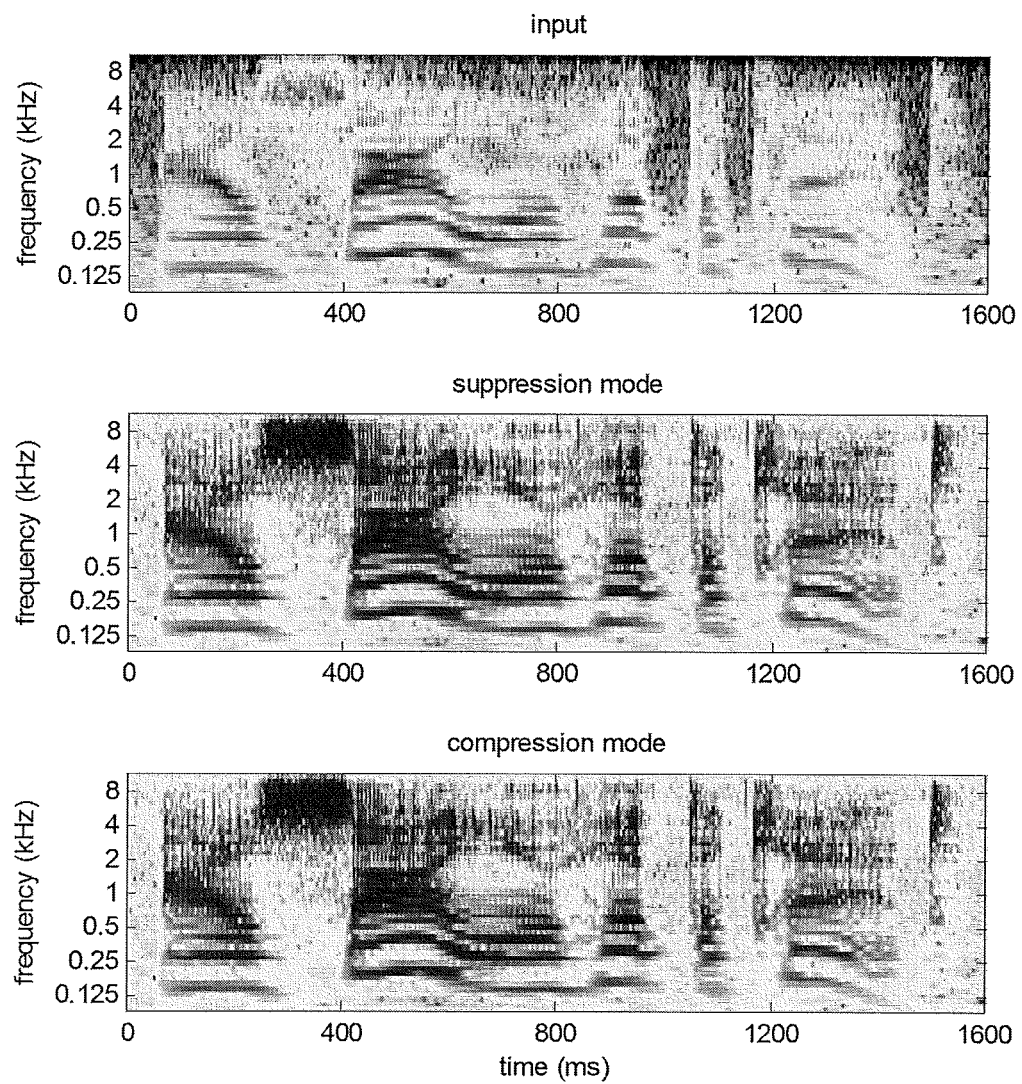
FIG. 13 shows input speech signal (top panel) and output speech signals obtained in suppression mode (middle panel) and in compression mode (bottom panel).
Figure 14:
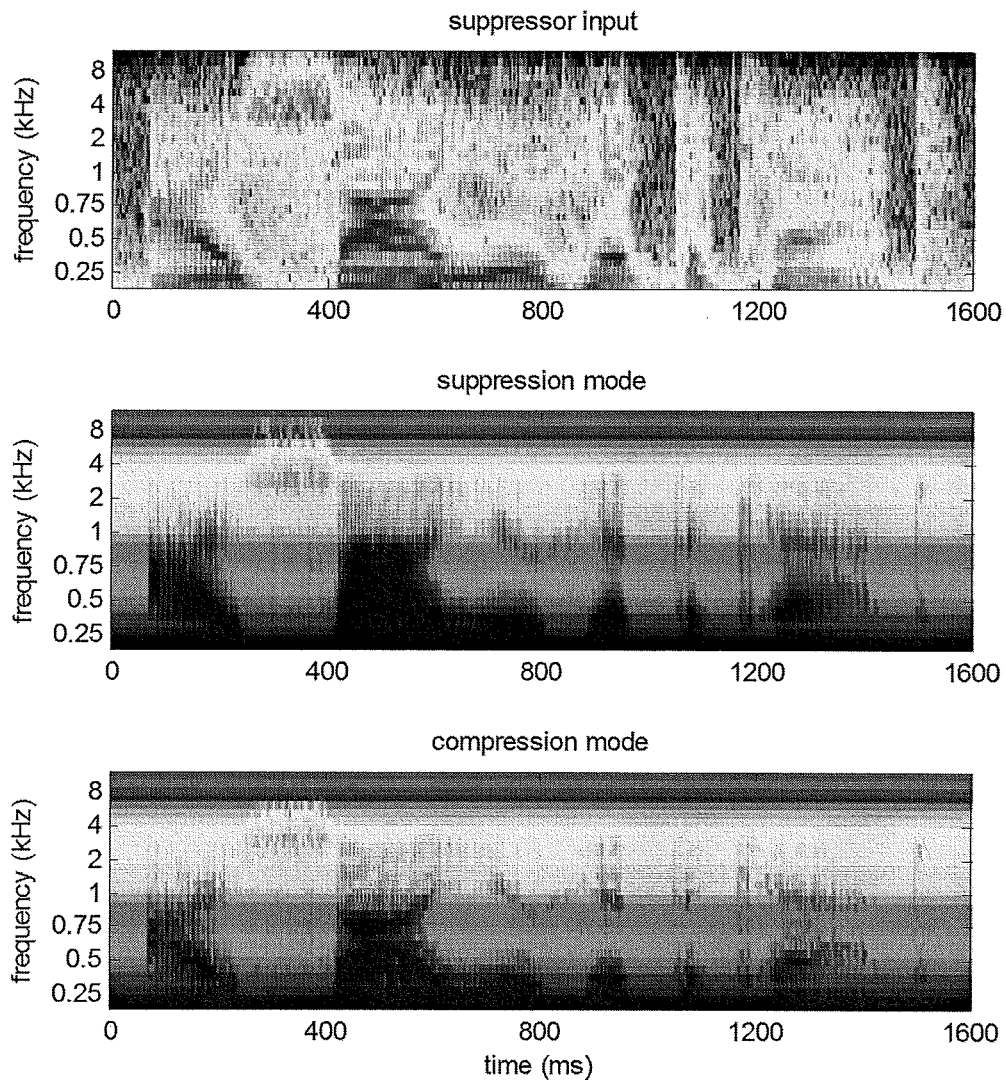
FIG. 14 shows an input to the suppressor stage (top panel) and gains to be applied in this stage in suppression mode (middle panel) and in compression mode (bottom panel).

FIG. 12 shows time-domain plots of the input speech (top panel) and the output speech obtained in suppression mode (middle panel) and compression mode (bottom panel). Note that different ordinate scales are used for the input and the outputs for visual clarity. The average level of the input speech is 54 dB SPL, and the average levels of the output speech are 68.1 and 69.3 dB SPL for suppression and compression modes, respectively. FIG. 13 shows gammatone spectrograms of the input and output speech signals. The output speech obtained in suppression and compression modes look very similar, but the difference between the two can be observed by looking at gain as a function of time and frequency, as plotted in the spectrograms of FIG. 14. FIG. 14 shows the input to the suppressor stage (top panel) and the gain that to be applied to this speech signal. In both suppression and compression modes, the gain is higher at high frequencies compared to low frequencies, as expected from the gain functions of FIG. 11 (right panel). Also the gain in both modes is lower during formants. However, the gain for compression mode (bottom panel) preserves formant better than the gain for the suppression mode, i.e. there is better contrast between formant segments and non-formant segments. This effect is expected as the lack of cross-channel interactions in the compression mode means that the gain is more localized in frequency.

Regarding Suppression Model

Attempts to restore normal two-tone suppression through a hearing aid have been proposed before. Turicchia and Sarpeshkar described a strategy for restoring effects of two-tone suppression in hearing-impaired individuals that uses multiband compression followed by expansion (see Turicchia et al. (2005)). The compressing-and-expanding (companding) can lead to two-tone suppression in the following manner. For a given band, a broadband filter was used for the compression stage and a narrowband filter for the expansion stage. An intense tone with a frequency outside the narrowband filter passband of the expander but within the passband of the broadband filter of the compressor results in a reduction of the level of a tone at the frequency of the expander but is then filtered out by the narrowband expander, producing two-tone suppression effects. They suggested that parameters for their system can be selected to mimic the auditory system; however, subsequent evaluation of their strategy only resulted in small improvements in speech intelligibility (see Oxenham et al. (2007) and Bhattacharya et al. (2007)).

Strelcyk et al. described an approach to restore loudness growth—restoration of normal loudness summation and differential loudness (see Strelcyk et al. (2012). Loudness summation is a phenomenon where a broadband sound is perceived as being louder than a narrowband sound when the two sounds have identical sound pressure level. Loudness summation is achieved in the system of Strelcyk et al. by widening the bandwidth of channel filters as level increases.

The hearing-aid signal-processing strategy described herein, at least in one embodiment, may perform two-tone suppression by considering the instantaneous output of all frequency channels when calculating the gain for a particular channel. This cross-channel influence in the calculation of gain is based on DPOAE STC measurements and may be applied instantaneously.

In addition to the goal of restoring two-tone suppression, the strategy herein also aims at restoring normal loudness growth through the use of individual measurements of CLS. Although restoration of loudness through a hearing aid has been proposed before (e.g., see Allen et al. (1990); Allen (1997); and Cox (1995)), it has never been clear how to use narrowband loudness data to prescribe amplification that restores normal loudness for complex sounds. Furthermore, concerns have been raised regarding gain for low-level inputs because HI listeners frequently complain that such an approach makes background noise loud. At least one embodiment described herein using two-tone suppression extends loudness-growth restoration to complex sounds, and may control issues associated with amplified background noise, while still making low-level sounds audible for HI listeners in the absence of background noise. Providing nonlinear gain without suppression will amplify low-level noise as well as low-level signals of interest. By including suppression, one may be able to reduce the gain for background noise while still providing gain for low-level signals. This may be similar to enhancement of spectral contrasts that is achieved by our signal-processing algorithm when processing vowels (see FIGS. 18 and 20, and the Table I of FIG. 19).

One or more embodiments herein focus on the hypothesis that loss of suppression is a significant contributor to abnormal loudness summation in HI ears. Therefore, integration of suppression and nonlinear gain based on loudness of single tones has the potential to compensate for loudness summation. The loudness data used for prescribing gain may define the level of a single tone that will restore normal loudness in HI individuals. The suppression may describe how the level of one tone affects the level of another tone at a different frequency. This combined effect may be generalized to loudness restoration for broadband stimuli, thus compensating for loudness summation.

The performance of at least one embodiment of the signal-processing strategy described herein was demonstrated by showing results of a SHA simulation. This simulation produces STCs that are qualitatively similar to DPOAE STCs data (compare FIGS. 1 and 9). The SHA simulation also provides enhancement of spectral contrast (see FIGS. 18 and 20), which may improve speech perception in the presence of background noise. For the set of vowels used here to evaluate spectral-contrast enhancement, the largest SCE was obtained at an input level of 85 dB SPL, a level that is greater than conversational speech level. Above this level, SCE decreased but was still greater than zero. This shows that the strategy herein may be able to provide speech-perception benefits for a range of speech levels that include levels mostly encountered for speech.

Previous studies have shown that consonant identification is more critical for speech perception, compared to vowel identification, especially in the presence of background noise (e.g., see Gordon-Salant (1986)), and that signal-processing strategies aimed at enhancing consonants and other transient parts of speech can improve speech perception in the presence of background noise (e.g., see Rasetshwane et al. (2009)). The strategy herein does not aim to enhance consonants but aims to restore normal cochlear suppression. At least one goal may be to focus on restoration of cochlear processes that are diminished with hearing loss, including suppression and compression. In turn, their restoration may improve speech perception and/or sound quality. At the very least, instantaneous compression and flat group delay of the strategy herein may preserve transients in the presence of background noise.

The implementation of suppression in one embodiment of the hearing-aid signal-processing strategy herein is based on DPOAE STC measurements. DPOAE STCs might underestimate suppression and tuning because of the three-tone stimulus that is used during their measurement. In fact, data have suggested that stimulus-frequency OAE (SFOAE) suppression tuning is sharper (see Keefe, et al., 2008). Therefore, sharper tuning may be beneficial in at least one implementation of suppression described herein.

The hearing-aid fitting strategy described herein may require a normative reference loudness function to determine the gain required for an individual HI individual. This normative reference should be constructed with care as loudness scaling data are characterized by variability, especially across different scaling procedures (see Elberling (1999)). However, Al-Salim et al. (2010) demonstrated that loudness scaling data for a single procedure can be reliable and repeatable, with variability (standard deviation of the mean difference between sessions) that is similar to that of audiometric thresholds.

At least one aim of the hearing-aid fitting strategy described herein may be to restore normal loudness in HI individuals by providing gain to a HI individual such that a tone that is perceived as 'very soft' by a NH individual is also perceived as 'very soft' by a HI individual, and a tone that is perceived as 'very loud' by a NH individual is also perceived as 'very loud' by a HI individual. Using two end-points in the gain calculation assumes a linear CLS function for a HI individual. However, a typical CLS function is often characterized by two distinct linear segments connected around 'medium' loudness (e.g., see Al-Salim et al. (2010); Brand et al. (2002); and ISO (2006)). A third category, 'medium' loudness may be used in our fitting strategy (i.e., provide gain to HI individual such that a tone that is perceived as 'medium' by a NH individual is also perceived as 'medium' by a HI individual).

The gain required to restore normal loudness of "very soft" sounds $G_{cs}$ may result in acoustic feedback. This feedback may be reduced or eliminated by requiring that $G_{cs}$ in one or more channels be reduced below what would otherwise be required to restore normal loudness of "very soft" sounds; that is, $G_{cs}$ should be less than $\overline{G}_{max}$ where $\overline{G}_{max}$ is a maximum gain that does not result in feedback. This may be done by selecting a new knee-point $L_{cs}$ that achieves the desired $G_{cs} \leq \overline{G}_{max}$ without altering the desired input-gain function at levels above the new $L_{cs}$. In this way, the processing strategy described herein may easily be adapted to constraints imposed by the need to eliminate feedback, while still restoring normal cross-channel suppression at higher levels. One or more impacts of feedback on the signal-processing strategy could also be reduced by avoiding "open canal" hearing-aid designs for moderate or greater hearing losses. "Open canal" hearing aids result in more feedback because the opening allows the hearing-aid microphone to pick up sound from the receiver.

At least one goal of one embodiment of the signal-processing strategy described herein may be to compensate for effects due to OHC damage which diminishes suppression and dynamic range and results in loudness recruitment. OHC damage results in no more than about a 60-dB loss; as a result, the algorithm may be designed to ameliorate consequences from hearing losses less than or equal to 60 dB. It may not be designed to ameliorate problems associated with inner hair cell damage or damage to primary afferent fibers, which are typically associated with greater degrees of hearing loss. Alternate and/or additional strategies may be needed to provide relief in these cases. However, it is possible that some combination of strategies that include SHA processing might be shown to provide benefit in these cases as well, in addition to overcoming consequences of mild-to-moderate hearing loss due to OHC damage.

One or more embodiments of the strategy herein incorporate methods that may restore both normal suppression and loudness growth. To a first approximation, the amount of forward masking depends on the response to the masker and is thought to reflect short-term adaptation processes mediated at the level of the hair-cell/afferent fiber synapse. To the extent that our implementation controls gain, it also may control the response elicited by any signal. In turn, it is expected that compressive gain may also influence adaptation effects at the synapse and perhaps influence forward masking through this mechanism. It may be possible that the signal processing may cause forward and backward masking to become closer to normal by quickly restoring normal loudness as a function of time.

One or more variations of the strategy described herein may be beneficial. For example, hearing-aid hardware issues, such as computational efficiency and power consumption, may be addressed. For example, in a hearing aid, every computation draws power from the battery, so computational efficiency is important for maximizing battery life. The gammatone filters of the filterbank described herein may be implemented using fourth-order IIR filters. In general, a fourth-order IIR filter has five coefficients in the numerator and five coefficients in the denominator. Application of the filter requires a multiplication operation for each coefficient. The coefficients are typically normalized so that the first denominator coefficient equals 1, requiring 9 potential multiplications. Two of the numerator coefficients in our gammatone filters may always zero. Therefore, our gammatone filters may require seven complex multiplications per sample or 14 real multiplications per sample. With 31 channels and a sampling rate of 24 kHz, our gammatone filterbank may require 434 multiplications per sample or about 10.4 million multiplications per second for a 12-kHz bandwidth. There are various ways to reduce the number of multiplications per second, which would increase computational efficiency and thereby reduce power consumption. For example, a 6-kHz bandwidth, which requires only 25 channels and a sampling rate of 12-kHz, would reduce the number of multiplications at the filterbank stage to about 4.2 million multiplications per second. Herzke and Hohmann outlined additional strategies for improving the computational efficiency of the gammatone filterbank (see Herzke et al. (2007)).

Further computational efficiency may be achieved by making changes to the suppressor stage. Instead of calculating and applying gain on a sample-by-sample basis, some form of efficient down-sampling that is transparent to the output signal may be applied. For example, in one implementation, the computation time required by the suppression stage may be approximately equal to the computation time required by the filterbank. Through simulations using the full filterbank (31 channels and a sampling rate of 24 kHz), one may be able to reduce the number of floating-point operations per second (flops, as reported by MATLAB) from 255 Mflops to 108 Mflops by down-sampling the gain calculation by a factor of six. Computational efficiency may be improved further by limiting the number of channels that are used for calculating the suppressive level in Eq. (5).

At least one model or implementation of suppression described herein unifies cochlear compression with cross-frequency influences on level-dependent gain at each specific frequency. In this combined model, gain at each frequency is dependent to varying degrees on the instantaneous level of frequency components across the entire audible range of frequencies, in a manner that realizes cochlear-like two-tone suppression. The similarity of this model to cochlear suppression is demonstrated in the similarity of simulated STCs to measured DPOAE STCs in humans with NH. The presence of suppression apparently may result in the preservation of local spectral contrasts, which may be useful for speech perception in background noise. The strategy described herein is computationally efficient enough for real-time implementation with current hearing-aid technologies and may be benefits in terms of listener preference and speech intelligibility.

The following references are incorporated by reference herein:

B. C. J. Moore and D. A. Vickers, "The role of spread excitation and suppression in simultaneous masking," J. Acoust. Soc. Am., vol. 102, no. 4, pp. 2284-2290, October 1997.

I. Yasin and C. J. Plack, "The role of suppression in the upward spread of masking," J. Assoc. Res. Otolaryngol., vol. 6, no. 4, pp. 368-377, 2005.

J. Rodriguez et al., "The role of suppression in psychophysical tone-on-tone masking," J. Acoust. Soc. Am., vol. 127, no. 1, pp. 361-369, 2009.

M. A. Ruggero, L. Robles, and N. C. Rich, "Two-tone suppression in the basilar membrane of the cochlea: Mechanical basis of auditory-nerve rate suppression," B. C. J. Moore and D. A. Vickers, "The role of spread excitation and suppression in simultaneous masking," J. Acoust. Soc. Am., vol. 102, no. 4, pp. 2284-2290, October 1997.

W. S. Rhode and N. P. Cooper, "Two-tone suppression and distortion production on the basilar membrane in the hook region of cat and guinea pig cochleae," Hearing Research, vol. 66, no. 1, pp. 31-45, March 1993.

B. Delgutte, "Two-tone rate suppression in auditory-nerve fibers: Dependence on suppressor frequency and level," Hearing Research, vol. 49, no. 1-3, pp. 225-246, November 1990.

M. B. Sachs and N. Y. S. Kiang, "Two-tone inhibition in auditory-nerve fibers," J. Acoust. Soc. Am., vol. 43, no. 5, pp. 1120-1128, 1968.

H. Duifhuis, "Level effects in psychophysical two-tone suppression," J. Acoust. Soc. Amer., vol. 67, no. 3, pp. 914-927, 1980.

D. L. Weber, "Do off-frequency simultaneous maskers suppress the signal?," J. Acoust. Soc. Am., vol. 73, no. 3, pp. 887-893, 1983.

C. Abdala, "A developmental study of distortion product otoacoustic emission (2f1-f2) suppression in humans," Hearing Research, vol. 121, pp. 125-138, July 1998.

M. P. Gorga, S. T. Neely, D. Konrad-Martin, and P. A. Dorn, "The use of distortion product otoacoustic emission suppression as an estimate of response growth," J. Acoust. Soc. Am., vol. 111, no. 1, pp. 271-284, 2002.

M. P. Gorga, S. T. Neely, J. Kopun, and H. Tan, "Growth of suppression in humans based on distortion-product otoacoustic emission measurements," J. Acoust. Soc. Am., vol. 129, no. 2, pp. 801-816, 2011a.

M. B. Sachs and E. D. Young, "Effects of nonlinearities on speech encoding in the auditory nerve," J. Acoust. Soc. Am., vol. 68, no. 3, pp. 858-875, March 1980.

L. Turicchia and R. Sarpeshkar, "A bio-inspired companding strategy for spectral enhancement," IEEE Trans. Speech Audio Process., vol. 13, no. 2, pp. 243-253, March 2005.

A. J. Oxenham, A. M. Simonson, L. Turicchia, and R. Sarpeshkar, "Evaluation of companding-based spectral enhancement using simulated cochlear-implant processing," J. Acoust. Soc. Am., vol. 121, no. 3, pp. 1709-1716, 2007.

A. Bhattacharya and F. G. Zeng, "Companding to improve cochlear-implant speech recognition in speech-shaped noise," J. Acoust. Soc. Am., vol. 122, no. 2, pp. 1079-1089, 2007.

M. A. Stone and B. C. J. Moore, "Spectral feature enhancement for people with sensorineural hearing impairment: Effects on speech intelligibility and quality," J. Rehabil. Res. Dev., vol. 29, no. 2, pp. 39-56, 1992.

R. A. Schmiedt, "Acoustic injury and the physiology of hearing," J. Acoust. Soc. Am., vol. 76, no. 5, pp. 1293-1317, 1984.

C. Birkholz et al., "Growth of suppression using distortion-product otoacoustic emission measurements in hearing-impaired humans," J. Acoust. Soc. Am., vol. 132, no. 5, pp. 3305-3318, 2012.

S. C. Al-Salim et al., "Reliability of categorical loudness scaling and its relation to threshold," Ear and Hearing, vol. 31, no. 4, pp. 567-578, August 2010.

B. Scharf, "Loudness," in Handbook of Perception: Vol IV. Hearing, E. C. Carterette and M. P. Friedman, Eds. New York: Academic Press, 1978, pp. 187-242.

M. P. Gorga, S. T. Neely, J. Kopun, and H. Tan, "Distortion-product otoacoustic emission suppression tuning curves in humans," J. Acoust. Soc. Am., vol. 129, no. 2, pp. 817-827, 2011b.

T. Brand and V. and Hohmann, "An adaptive procedure for categorical loudness scaling," J. Acoust. Soc. Am., vol. 112, no. 4, pp. 1597-1604, 2002.

D. Byrne, H. Dillon, T. Ching, R. Katsch, and G. Keidser, "NAL-NL1 procedure for fitting nonlinear hearing aids: Characteristics and comparisons with other procedures," J. Amer. Acad. Audiol., vol. 12, pp. 37-51, 2001.

L. E. Cornelisse, R. C. Seewald, and D. G. Jamieson, "The input/output formula: A theoretical approach to the fitting of personal amplification devices," J. Acoust. Soc. Am., vol. 97, no. 3, pp. 1854-1864, 1995.

J. Rodriguez and S. T. Neely, "Temporal aspects of suppression in distortion-product otoacoustic emissions," J. Acoust. Soc. of Am., vol. 129, no. 5, pp. 3082-3089, 2011.

R. M. Arthur, R. R. Pfeiffer, and N. Suga, "Properties of 'two-tone inhibition' in primary auditory neurons," J. Physiol., vol. 212, no. 5, pp. 593-609, February 1971.

T. Herzke and V. Hohmann, "Improved Numerical Methods for Gammatone Filterbank Analysis and Synthesis," Acta. Acust. Acust., vol. 93, pp. 498-500, 2007.

R. D. Patterson and J. Holdsworth, "A functional model of neural activity patterns and auditory images," in Advances in Speech, Hearing and Language Processing, A. W. Ainsworth, Ed. Londom: JAI Press, 1996, pp. 547-563.

V. Hohmann, "Frequency analysis and synthesis using a gammatone filterbank," Acta. Acust. Acust., vol. 88, pp. 433-442, 2002.

C. A. Shera, J. J. Guinan, and A. J. Oxenham, "Otoacoustic estimation of cochlear tuning: Validation in the chinchilla," J. Assoc. Res. Otolaryngol., vol. 11, no. 3, pp. 343-365, September 2010.

A. Härmä. Derivation of the complex-valued gammatone filters. [Online at //www.acoustics.hut.fi/software/HUTear/Gammatone/Complex_gt.html]

R. Meddis, L. P. O'Mard, and E. A. Lopez-Poveda, "A computational algorithm for computing nonlinear auditory frequency selectivity," J. Acoust. Soc. Am., vol. 109, pp. 2852-2861, 2001.

M. L. Jepsen, S. D. Ewert, and T. Dau, "A computational model of human auditory signal processing and perception," J. Acoust. Soc. Am., vol. 124, no. 1, pp. 422-438, 2008.

W. S. Rhode and L. Robles, "Evidence from Mossbauer experiments for nonlinear vibration in the cochlea," J. Acoust. Soc. Am., vol. 55, no. 3, pp. 588-596, 1974.

M. A. Stone, B. C. J. Moore, K. Meisenbacher, and R. P. Derleth, "Tolerable hearing aid delays. V. Estimation of limits for open canal fittings," Ear and Hearing, vol. 29, no. 4, pp. 601-617, August 2008.

B. C. J. Moore and C. T. Tan, "Perceived naturalness of spectrally distorted speech and music," J. Acoust. Soc. Am., vol. 114, no. 1, pp. 408-419, 2003.

E. M. Zettner and R. C. Folsom, "Transient emission suppression tuning curve attributes in relation to psychoacoustic threshold," J. Acoust. Soc. Am., vol. 113, no. 4, pp. 2031-2041, 2003.

G. E. Peterson and H. L. Barney, "Control methods used in a study of the vowels," J. Acoust. Soc. Am., vol. 24, pp. 175-184, 1952.

ISO, "Acoustics—Loudness scaling by means of categories," ISO, 16832, 2006.

ISO, "Acoustics—Normal equal-loudness-level contours," ISO, 226, 2003.

O. Strelcyk, N. Nooraei, S. Kalluri, and B. Edwards, "Restoration of loudness summation and differential loudness growth in hearing-impaired listeners," J. Acoust. Soc. Am., vol. 132, no. 4, pp. 2557-2568, 2012.

J. B. Allen, J. L. Hall, and P. S. Jeng, "Loudness growth in ½-octave bands (LGOB)—A procedure for the assessment of loudness," J. Acoust. Soc. Amer., vol. 88, no. 2, pp. 745-753, 1990.

J. B. Allen, "Derecruitment by multiband compression in hearing aids," in Modeling Sensorineural Hearing Loss, W Jesteadt, Ed. Hillsdale: Lawrence Erlbaum, 1997, pp. 99-112.

R. M. Cox, "Using loudness data for hearing aid selection: The IHAFF approach," Hear. J., vol. 48, no. 2, pp. 39-42, 1995.

S. Gordon-Salant, "Recognition of natural and time/intensity altered CVs by young and elderly subjects with normal hearing," J. Acoust. Soc. Am., vol. 80, no. 6, pp. 1599-1607, 1986.

D. M. Rasetshwane, J. R. Boston, C. C. Li, J. D. Durrant, and G. Genna, "Enhancement of speech intelligibility using transients extracted by wavelet packets," in IEEE Workshop on Applications of Signal Processing to Audio and Acoustics, New Paltz, 2009, pp. 173-176.

D. H. Keefe, J. C. Ellison, D. F. Fitzpatrick, and M. P. Gorga, "Two-tone suppression of stimulus frequency otoacoustic emissions," J. Acoust. Soc. Am., vol. 123, no. 3, pp. 1479-1494, 2008.

C. Elberling, "Loudness scaling revisited," J. Am. Acad. Audiol., vol. 10, pp. 248-260, 1999.

T. Herzke and V. Hohmann, "Effects of Instantaneous Multiband Dynamic Compression on Speech Intelligibility," EURASIP J. Adv. Signal Process., vol. 18, pp. 3034-3043, 2005. J. Neurophysiol, vol. 68, pp. 1087-1099, 1992.

All patents, patent documents, and references cited herein are incorporated in their entirety as if each were incorporated separately. This disclosure has been provided with reference to illustrative embodiments and is not meant to be construed in a limiting sense. As described previously, one skilled in the art will recognize that other various illustrative applications may use the techniques as described herein to take advantage of the beneficial characteristics of the apparatus and methods described herein. Various modifications of the illustrative embodiments, as well as additional embodiments of the disclosure, will be apparent upon reference to this description.

What is claimed is:

1. A method of processing an audio signal comprising:
   receiving an audio signal input;
   separating the audio signal input into a plurality of frequency bands;
   compressing each of the plurality of frequency bands, wherein compressing each respective frequency band of the plurality of frequency bands comprises applying a time-varying gain to each respective frequency band based on a modeled suppressive level for the respective frequency band resulting in a compressed respective frequency band, wherein the suppressive level for the respective frequency band is dependent on the instantaneous audio signal input level of one or more frequency bands adjacent to the respective frequency band to which the gain is applied, and further wherein applying the time-varying gain to each respective frequency band based on the modeled suppressive level for the respective frequency band comprises determining the suppressive level for the respective frequency band using equations based on normal two-tone suppression for the respective frequency band; and
   combining the compressed respective frequency bands for use in providing an audio signal output.

2. A compression system comprising:
   an audio signal input;
   processing apparatus configured to separate the audio signal input into a plurality of frequency bands and further configured to compress each of the plurality of frequency bands, wherein compressing each respective frequency band of the plurality of frequency bands comprises applying a time varying gain to each respective frequency band based on a modeled suppressive level for the respective frequency band resulting in a compressed respective frequency band, wherein the suppressive level for the respective frequency band is dependent on the instantaneous audio signal input level of one or more frequency bands adjacent to the respective frequency band to which the gain is applied, and further wherein applying the time-varying gain to each respective frequency band based on the modeled suppressive level for the respective frequency band comprises determining the suppressive level for the respective frequency band using equations based on normal two-tone suppression for the respective frequency band, wherein the processing apparatus is further configured to combine the compressed respective frequency bands for use in providing an audio signal output.

3. A hearing aid system comprising:
   an input transducer apparatus configured to convert a sound pressure signal to an audio signal input;
   processing apparatus configured to separate the audio signal input into a plurality of frequency bands and configured to compress each of the plurality of frequency bands, wherein compressing each respective frequency band of the plurality of frequency bands comprises applying a time-varying gain to each respective frequency band based on a modeled suppressive level for the respective frequency band resulting in a compressed respective frequency band, wherein the suppressive level for the respective frequency band is dependent on the instantaneous audio signal input level of one or more frequency bands adjacent to the respective frequency band to which the gain is applied, wherein applying a time-varying gain to each respective frequency band based on the modeled suppressive level for the respective frequency band comprises determining the suppressive level for the respective frequency band using equations based on normal two-tone suppression for the respective frequency band, wherein the processing apparatus is further configured to combine the compressed respective frequency bands for use in providing an audio signal output; and
   an output transducer apparatus configured to provide a sound pressure signal based on the audio signal output.

4. A method of processing an audio signal comprising:
receiving an audio signal input;
separating the audio signal input into a plurality of frequency bands;
compressing each of the plurality of frequency bands, wherein compressing each respective frequency band of the plurality of frequency bands comprises applying a time-varying gain to each respective frequency band based on a modeled suppressive level for the respective frequency band resulting in a compressed respective frequency band, wherein the suppressive level for the respective frequency band is dependent on the instantaneous audio signal input level of one or more frequency bands adjacent to the respective frequency band to which the gain is applied, wherein the signal of one or more of the respective frequency bands is delayed by an amount that varies based on the suppressive level for the respective frequency band; and
combining the compressed respective frequency bands for use in providing an audio signal output.

5. The method of claim 1, wherein separating the audio signal input into a plurality of frequency bands comprises separating the audio signal input into a plurality of contiguous frequency bands, and further wherein the suppressive level for the respective frequency band is dependent on the instantaneous audio signal input level of one or more frequency bands adjacent to the respective frequency band to which the gain is applied.

6. A method of processing an audio signal comprising:
receiving an audio signal input;
separating the audio signal input into a plurality of frequency bands;
compressing each of the plurality of frequency bands, wherein compressing each respective frequency band of the plurality of frequency bands comprises applying a time-varying gain to each respective frequency band based on a suppressive level for the respective frequency band resulting in a compressed respective frequency band, wherein the suppressive level for the respective frequency band is dependent on the audio signal input level of one or more frequency bands adjacent to the respective frequency band to which the gain is applied, and further wherein the suppressive level for the respective frequency band is a logarithmic transformation of a suppressive intensity of the one or more frequency bands adjacent to the respective frequency band to which the gain is applied; and
combining the compressed respective frequency bands for use in providing an audio signal output.

7. The method of claim 6, wherein the suppressive intensity is the sum of a plurality of channel-specific suppressive intensities corresponding to a plurality of frequency bands adjacent to the respective frequency band, and further wherein each of the channel-specific suppressive intensities have exponents that are linear functions of the audio signal input level of the corresponding frequency band of the plurality of frequency bands.

8. The method of claim 1, wherein the time-varying gains for the respective frequency bands are piecewise linear functions of the suppressive level.

9. A method of processing an audio signal comprising:
receiving an audio signal input;
separating the audio signal input into a plurality of frequency bands;
compressing each of the plurality of frequency bands, wherein compressing each respective frequency band of the plurality of frequency bands comprises applying a time-varying gain to each respective frequency band based on a modeled suppressive level for the respective frequency band resulting in a compressed respective frequency band, wherein the suppressive level for the respective frequency band is dependent on the instantaneous audio signal input level of one or more frequency bands adjacent to the respective frequency band to which the gain is applied, wherein the time-varying gains for the respective frequency bands are piecewise linear functions of the suppressive level, wherein the time-varying gain applied to each respective frequency band based on a suppressive level for the respective frequency band is a constant gain when the suppressive level is below a specified compression-start level, is a constant gain above a specified compression-end level, and, at intermediate levels between the compression-start level and compression-end level, the gain decreases as a linear function of the suppressive level; and
combining the compressed respective frequency bands for use in providing an audio signal output.

10. The method of claim 9, wherein the compression-start level for each frequency band is a sound pressure level perceived as "very soft" by normal-hearing ears, wherein the gain applied at this compression-start level is based on the excess sound pressure level required by a hearing-impaired individual for "very-soft" perception.

11. The method of claim 9, wherein the compression-start level for each frequency band is a sound pressure level at the threshold of hearing a tone for normal-hearing ears, wherein the gain applied at this compression-start level is based on the excess sound pressure level required by a hearing-impaired individual for the same tone threshold.

12. The method of claim 9, wherein the compression-end level for each frequency band is a sound pressure level perceived as "very loud" by normal-hearing ears, wherein the gain applied at this compression-end level is based on the excess sound pressure level required by a hearing-impaired individual for "very-loud" perception.

13. The method of claim 9, wherein the signal of one or more of the respective frequency bands is delayed by an amount that varies based on the suppressive level for the respective frequency band.

14. The method of claim 13, wherein the delay added is constant below the compression-start level, the delay is zero above the compression-end level, and the delay is a decreasing function at intermediate suppressor levels.

15. The method of claim 1, wherein the suppressive level for the respective frequency band is about equal to instantaneous audio signal level of the respective frequency band.

16. A method of processing an audio signal comprising:
receiving an audio signal input;
separating the audio signal input into a plurality of frequency bands;
compressing each of the plurality of frequency bands, wherein compressing each respective frequency band of the plurality of frequency bands comprises applying a time-varying gain to each respective frequency band based on a modeled suppressive level for the respective frequency band resulting in a compressed respective frequency band, wherein the suppressive level for the respective frequency band is dependent on the instantaneous audio signal input level of one or more frequency bands adjacent to the respective frequency band to which the gain is applied, wherein applying the time-varying gain to each respective frequency band comprises applying a time-varying gain at a plurality of sequential times based on a suppressive level for the respective frequency band determined using equations based on normal two-tone suppression for the respective frequency band, wherein the time-varying gain at intermediate time steps between adjacent sequential times is linearly interpolated between the adjacent sequential times; and combining the compressed respective frequency bands for use in providing an audio signal output.

17. The method of claim 1, wherein the audio signal input comprises a complex valued input signal including both amplitude and phase components.

18. The method of claim 1, wherein the bandwidths of the plurality of frequency bands are contiguous and sized such that high frequency delay is 5 milliseconds or less.

19. A method of processing an audio signal comprising:

receiving an audio signal input;

separating the audio signal input into a plurality of frequency bands;

compressing each of the plurality of frequency bands, wherein compressing each respective frequency band of the plurality of frequency bands comprises applying a time-varying gain to each respective frequency band based on a modeled suppressive level for the respective frequency band resulting in a compressed respective frequency band, wherein the suppressive level for the respective frequency band is dependent on the instantaneous audio signal input level of one or more frequency bands adjacent to the respective frequency band to which the gain is applied;

combining the compressed respective frequency bands for use in providing an audio signal output; and applying frequency specific time and phase adjustments to the audio signal input to cause the audio signal output to move towards a flatter delay across the entire range of audible frequencies.

20. The method of claim 19, wherein the method further comprises applying frequency-specific time and phase adjustments to the audio signal input to improve the preservation of transient signals by causing the summed output of the suppressor to have the flattest possible delay across the entire range of audible frequencies.

21. The method of claim 4, wherein applying a time-varying gain to each respective frequency band based on a suppressive level for the respective frequency band comprises determining the suppressive level for the respective frequency band using equations based on normal two-tone suppression for the respective frequency band.

22. The method of claim 6, wherein applying a time-varying gain to each respective frequency band based on a suppressive level for the respective frequency band comprises determining the suppressive level for the respective frequency band using equations based on normal two-tone suppression for the respective frequency band.

23. The method of claim 9, wherein applying a time-varying gain to each respective frequency band based on a suppressive level for the respective frequency band comprises determining the suppressive level for the respective frequency band using equations based on normal two-tone suppression for the respective frequency band.

24. The method of claim 19, wherein applying a time-varying gain to each respective frequency band based on a suppressive level for the respective frequency band comprises determining the suppressive level for the respective frequency band using equations based on normal two-tone suppression for the respective frequency band.

* * * * *